US012666656B2

(12) United States Patent
Cheng et al.

(10) Patent No.: US 12,666,656 B2
(45) Date of Patent: Jun. 23, 2026

(54) TRANSISTOR DEVICE WITH MULTI-LAYER CHANNEL STRUCTURE

(71) Applicant: Taiwan Semiconductor Manufacturing Company, Ltd., Hsinchu (TW)

(72) Inventors: Ya-Yun Cheng, Taichung City (TW); Wen-Ling Lu, Taoyuan County (TW); Yu-Chien Chiu, Hsinchu County (TW); Chung-Wei Wu, Ju-Bei City (TW); Zhiqiang Wu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 608 days.

(21) Appl. No.: 18/149,715

(22) Filed: Jan. 4, 2023

(65) Prior Publication Data

US 2024/0113234 A1 Apr. 4, 2024

Related U.S. Application Data

(60) Provisional application No. 63/411,203, filed on Sep. 29, 2022.

(51) Int. Cl.
| | |
|---|---|
| *H10D 30/67* | (2025.01) |
| *H10D 30/69* | (2025.01) |
| *H10D 62/80* | (2025.01) |
| *H10D 99/00* | (2025.01) |

(52) U.S. Cl.
CPC ..... *H10D 30/6757* (2025.01); *H10D 30/6734* (2025.01); *H10D 30/6755* (2025.01); *H10D*

*99/00* (2025.01); *H10D 30/6739* (2025.01); *H10D 30/701* (2025.01); *H10D 62/80* (2025.01)

(58) Field of Classification Search
CPC ........... H10D 30/6755; H10D 30/6756; H10D 30/6757; H10D 30/6732; H10D 30/6734; H10D 30/0316; H10D 62/80; H10D 62/875
See application file for complete search history.

(56) References Cited

U.S. PATENT DOCUMENTS

| | | | | |
|---|---|---|---|---|
| 11,302,810 B1 * | 4/2022 | Gong | ................. | H10D 30/6757 |
| 2005/0199880 A1 * | 9/2005 | Hoffman | ............ | H10D 30/6755 257/72 |
| 2010/0193782 A1 * | 8/2010 | Sakata | ............... | H10D 30/6755 257/E21.414 |
| 2015/0069385 A1 * | 3/2015 | Yamamoto | ............. | H10D 99/00 257/43 |

(Continued)

*Primary Examiner* — Vincent Wall
(74) *Attorney, Agent, or Firm* — Eschweiler & Potashnik, LLC

(57) ABSTRACT

An integrated chip including a gate layer. An insulator layer is over the gate layer. A channel structure is over the insulator layer. A pair of source/drains are over the channel structure and laterally spaced apart by a dielectric layer. The channel structure includes a first channel layer between the insulator layer and the pair of source/drains, a second channel layer between the insulator layer and the dielectric layer, and a third channel layer between the second channel layer and the dielectric layer. The first channel layer, the second channel layer, and the third channel layer include different semiconductors.

20 Claims, 24 Drawing Sheets

900

(56)         References Cited

U.S. PATENT DOCUMENTS

| | | | |
|---|---|---|---|
| 2015/0263174 A1* | 9/2015 | Yamazaki | H10D 30/6715 |
| | | | 257/43 |
| 2017/0062484 A1* | 3/2017 | Hsu | H10D 86/423 |
| 2017/0170211 A1* | 6/2017 | Yamazaki | H10D 30/6732 |
| 2018/0006124 A1* | 1/2018 | Murakawa | H10D 30/681 |
| 2018/0013003 A1* | 1/2018 | Yamazaki | H10D 30/6734 |
| 2018/0166578 A1* | 6/2018 | Yamazaki | H10D 86/60 |
| 2019/0229217 A1* | 7/2019 | Kimura | H10D 86/423 |
| 2020/0044039 A1 | 2/2020 | Liu | |
| 2020/0098933 A1* | 3/2020 | Tanaka | H10D 30/6756 |
| 2020/0126990 A1 | 4/2020 | Zhang | |
| 2020/0168555 A1 | 5/2020 | Huang et al. | |
| 2020/0388685 A1* | 12/2020 | Sharma | H10D 62/83 |
| 2021/0167211 A1* | 6/2021 | Yamazaki | H10D 30/69 |
| 2022/0122995 A1* | 4/2022 | Ocker | H10D 30/6735 |
| 2022/0122999 A1* | 4/2022 | Polakowski | H10B 53/30 |
| 2022/0140148 A1* | 5/2022 | Nam | H10D 62/151 |
| | | | 257/295 |
| 2022/0302143 A1* | 9/2022 | Cheng | H01L 21/02565 |
| 2022/0352385 A1* | 11/2022 | Chiang | H10D 30/6755 |
| 2023/0013047 A1* | 1/2023 | Chou | H10B 63/30 |
| 2024/0113234 A1* | 4/2024 | Cheng | H10D 99/00 |

* cited by examiner

100

200a

300

400

500

1000

1100

1200

1300a 208
206
204
202

1300b 208
206
204
202

1400a

1404

1402

208

206

204

202

1400b

1402

208
206
204

202

1500a 208
206
204
102
202

1500b 208
206
204
202
102

1600a

1600b

1700a

1700b

1800a

1800b

1900a

1900b

2100a

2100b

2200a

2200b

2300a

2300b

2400a

2400b

2500a 108a        110        112                    108b

116

210
106

104

208

206

204

202

210

102

2500b

116

210

104

208
206
204

202

102

2600a

2600b

2700a

2700b

2800a 114a    116    2802    116    114b 2804
116    116
108a    108b
210    210
106    110    112
104
208    102
206
204

202

2800b 2802
114a    112    110    114b
108b 116
108a
210
104
208
206
204
202
102

2900a

2900b

3000

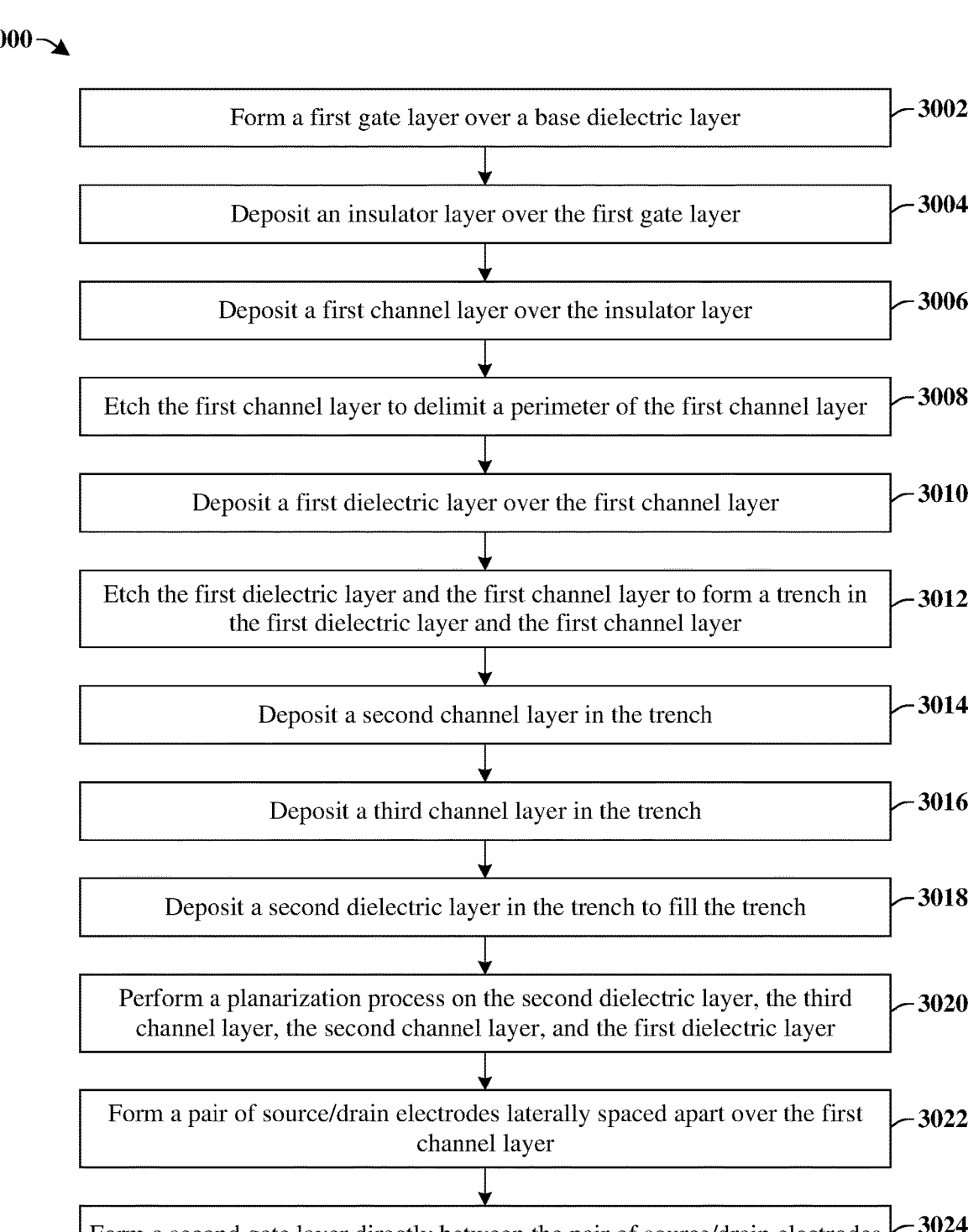

| Form a first gate layer over a base dielectric layer | 3002 |

| Deposit an insulator layer over the first gate layer | 3004 |

| Deposit a first channel layer over the insulator layer | 3006 |

| Etch the first channel layer to delimit a perimeter of the first channel layer | 3008 |

| Deposit a first dielectric layer over the first channel layer | 3010 |

| Etch the first dielectric layer and the first channel layer to form a trench in the first dielectric layer and the first channel layer | 3012 |

| Deposit a second channel layer in the trench | 3014 |

| Deposit a third channel layer in the trench | 3016 |

| Deposit a second dielectric layer in the trench to fill the trench | 3018 |

| Perform a planarization process on the second dielectric layer, the third channel layer, the second channel layer, and the first dielectric layer | 3020 |

| Form a pair of source/drain electrodes laterally spaced apart over the first channel layer | 3022 |

| Form a second gate layer directly between the pair of source/drain electrodes | 3024 |

Fig. 30

TRANSISTOR DEVICE WITH MULTI-LAYER CHANNEL STRUCTURE

REFERENCE TO RELATED APPLICATION

This application claims the benefit of U.S. Provisional Application No. 63/411,203, filed on Sep. 29, 2022, the contents of which are hereby incorporated by reference in their entirety.

BACKGROUND

Many electronic devices contain a multitude of transistor devices. Some transistor devices include metal oxide semiconductor field effect transistors (MOSFETs) and ferroelectric field effect transistors (FeFETs). A transistor device includes a gate arranged between a source and a drain. Transistor devices may be categorized as high voltage (HV), medium voltage (MV) or low voltage (LV) devices, depending on the magnitude of the voltage applied to the gate to turn the transistor on. The structural design parameters of each transistor in an electronic device vary depending on the desired electrical properties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A-29A illustrate cross-sectional views and FIGS. 13B-29B illustrate corresponding three-dimensional views, respectively, of some embodiments of a method for forming a transistor device comprising a plurality of channel layers between a first gate layer and a pair of source/drain electrodes.

FIG. 30 illustrates a flow diagram of some embodiments of a method for forming a transistor device comprising a plurality of channel layers between a first gate layer and a pair of source/drain electrodes.

DETAILED DESCRIPTION

Figure 1:
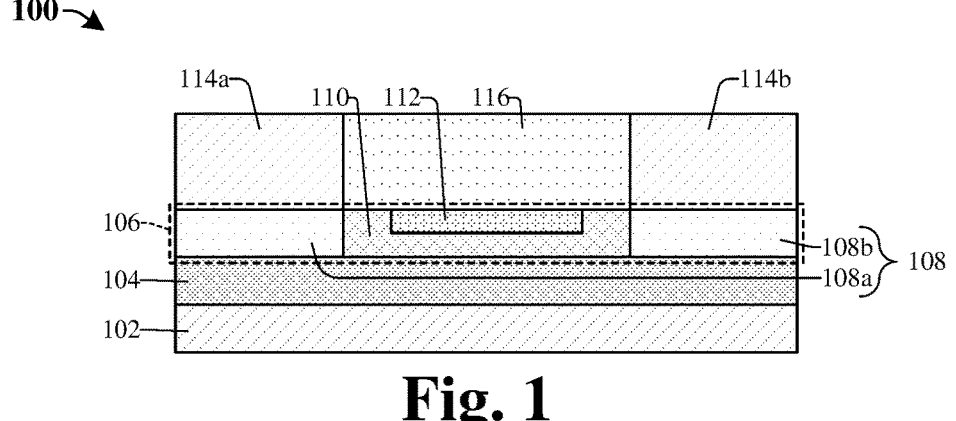
FIG. 1 illustrates a cross-sectional view of some embodiments of a transistor device comprising a plurality of channel layers between a first gate layer and a pair of source/drain electrodes.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor device includes a gate layer. An insulator layer is over the gate layer. A channel layer is over the insulator layer. The channel layer includes a metal-oxide semiconductor (e.g., zinc oxide, tin oxide, Iridium gallium zinc oxide, etc.). A dielectric layer, a first source/drain electrode, and a second source/drain electrode are over the channel layer. The first source/drain electrode and the second source/drain electrode laterally spaced apart by the dielectric layer. The channel layer continuously extends from along a bottom of the first source/drain electrode to along a bottom of the second source/drain electrode.

A challenge with these transistor devices is that the channel layer may limit a performance of the transistor device. For example, a carrier concentration of the channel layer affects the performance of the transistor device. Increasing the carrier concentration of the channel layer may increase the current through the transistor device, which may improve a speed of the transistor device. However, increasing the carrier concentration of the channel layer may also reduce the threshold voltage of the transistor device, which may increase a leakage of the transistor device. Conversely, reducing the carrier concentration of the channel layer may increase the threshold voltage of the transistor device but may also reduce the current through the transistor device. Thus, a trade-off exists between the current through the transistor device and the threshold voltage of the transistor device. The performance of the transistor device may be limited by the trade-off between the current and the threshold voltage.

Various embodiments of the present disclosure are related to a transistor device comprising a plurality of channel layers for improving a performance of the transistor device.

For example, an insulator layer is over a gate layer. A pair of source/drain electrodes are over the insulator layer and laterally spaced apart by a dielectric layer. A first channel layer is between the insulator layer and the pair of source/drain electrodes. A second channel layer is between the insulator layer and the dielectric layer. A third channel layer is between the second channel layer and the dielectric layer. The first channel layer comprises a first semiconductor having a first carrier concentration. The second channel layer comprises a second semiconductor having a second carrier concentration less than the first carrier concentration. The third channel layer comprises a third semiconductor having a third carrier concentration less than the second carrier concentration.

By including the different channel layers having the different carrier concentrations between gate layer and the source/drain electrodes, a performance of the transistor device can be improved. For example, the carrier concentration of the first channel layer can be individually controlled to reduce the contact resistance between the channel structure and the source/drain electrodes. Reducing the contact resistance can increase the current through the transistor device and thus increase the speed of the transistor device. Further, the carrier concentration of the second and third channel layers can be individually controlled to increase the threshold voltage of the transistor device and thus reduce a leakage of the transistor device.

FIG. 1 illustrates a cross-sectional view 100 of some embodiments of a transistor device comprising a plurality of channel layers 108, 110, 112 between a first gate layer 102 and a pair of source/drain electrodes 114a, 114b.

An insulator layer 104 is over the first gate layer 102. In some embodiments, the insulator layer 104 comprises a high-k dielectric material (e.g., a dielectric having a dielectric constant greater than that of silicon dioxide). In some other embodiments, the insulator layer 104 comprises a ferroelectric material. In some embodiments, the transistor device is included in a memory array. In some embodiments, the first gate layer 102 forms a word line in the memory array. In some embodiments, the first gate layer 102 may alternatively be referred to as a first gate electrode.

A channel structure 106 is over the insulator layer 104. A pair of source/drain electrodes (e.g., a first source/drain electrode 114a and a second source/drain electrode 114b) are over the channel structure 106. The pair of source/drain electrodes 114a, 114b are laterally spaced apart by a dielectric layer 116. In some embodiments, the pair of source/drain electrodes 114a, 114b may be alternatively referred to as a pair of source/drains, a pair of source/drain layers, a pair of source/drain segments, or the like. Source/drain electrode(s) may refer to a source or a drain, individually or collectively dependent upon the context.

The channel structure 106 includes the plurality of channel layers 108, 110, 112. For example, the channel structure 106 includes a first channel layer 108 directly between the insulator layer 104 and the source/drain electrodes 114a, 114b. The first channel layer 108 includes pair of channel segments (e.g., a first channel segment 108a and a second channel segment 108b). The channel structure 106 further includes a second channel layer 110 directly between the insulator layer 104 and the dielectric layer 116. The second channel layer 110 laterally extends between sidewalls of the channel segments 108a, 108b. The channel structure 106 further includes a third channel layer 112 directly between the second channel layer 110 and the dielectric layer 116. The third channel layer 112 is directly over an upper surface of the second channel layer 110 and directly between sidewalls of the second channel layer 110.

The channel segments 108a, 108b of the first channel layer 108 comprise a first metal-oxide semiconductor having a first carrier concentration. The second channel layer 110 comprises a second metal-oxide semiconductor having a second carrier concentration, less than the first carrier concentration. The third channel layer 112 comprises a third metal-oxide semiconductor having a third carrier concentration, less than the second carrier concentration. The carrier concentrations of the channel layers 108, 110, 112 can be controlled by controlling the metal ratios (e.g., the ratio of the metal atoms to the oxygen atoms) of the metal-oxides of the channel layers 108, 110, 112. For example, oxygen vacancies (not shown) in the metal-oxide channel layers act as charge carriers, and the oxygen vacancy concentrations of the metal-oxide channel layers can be controlled by controlling the metal ratios of the metal-oxide channel layers. Increasing the metal ratio of one of the metal-oxide channel layers can increase the carrier concentration of that metal-oxide channel layer. Conversely, decreasing the metal ratio of one of the metal-oxide channel layers can decrease the carrier concentration of that metal-oxide channel layer.

By including the different channel layers 108, 110, 112 having the different carrier concentrations between the first gate layer 102 and the source/drain electrodes 114a, 114b, a performance of the transistor device can be improved. For example, the carrier concentration of the first channel layer 108 can be increased to reduce the contact resistance between the first channel layer 108 and the source/drain electrodes 114a, 114b. Reducing the contact resistance between the first channel layer 108 and the source/drain electrodes 114a, 114b can increase the current through the transistor device. Thus, a speed (e.g., a switching speed, a read speed, a write speed, or the like) of the transistor device may be improved.

Further, the carrier concentration of the second channel layer 110 can be reduced to increase the dielectric constant of the second channel layer 110. Increasing the dielectric constant of the second channel layer 110 can reduce the electric field between the second channel layer 110 and the insulator layer 104. Reducing the electric field between the second channel layer 110 and the insulator layer 104 can reduce an interface trap density (Dit) between the second channel layer 110 and the insulator layer 104. Reducing the interface trap density between the second channel layer 110 and the insulator layer 104 can reduce a leakage along the second channel layer 110. In addition, reducing the carrier concentration of the second channel layer 110 can improve a passivation of the second channel layer 110. For example, reducing the carrier concentration of the second channel layer 110 can reduce an impact of hydrogen diffusion into the second channel layer 110 on the threshold voltage of the transistor device. Thus, the threshold voltage can be improved. Increasing the threshold voltage of the transistor device can reduce the leakage of the transistor device. Reducing the leakage of the transistor device can improve the retention time of the transistor device.

Furthermore, the carrier concentration of the third channel layer 112 can be further reduced to further increase the threshold voltage of the transistor device. Thus, the leakage of the transistor device can be further reduced and the retention time of the transistor device can be further improved. In addition, reducing the carrier concentration of the third channel layer 112 can improve a thermal stability of the transistor device.

In some embodiments in which the insulator layer 104 comprises a ferroelectric, controlling the carrier concentration of the individual channel layers 108, 110, 112 can tune the polarization of the ferroelectric insulator layer 104 along the individual channel layers 108, 110, 112. Thus, the polarization of the ferroelectric insulator layer 104 can be tuned along different regions of the insulator layer 104 to tune the performance (e.g., a program and/or erase efficiency, a memory window, etc.) of the transistor device.

In some embodiments, the first gate layer 102 may, for example, comprise tungsten or some other suitable material. In some embodiments, the insulator layer 104 may, for example, comprise hafnium oxide, aluminum oxide, hafnium zirconium oxide, or some other suitable material. In some embodiments, the source/drain electrodes 114a, 114b may, for example, comprise titanium nitride, tungsten, or some other suitable material. In some embodiments, the dielectric layer 116 may, for example, comprise silicon dioxide or some other suitable material.

In some embodiments, any of the first channel layer 108, the second channel layer 110, and the third channel layer 112 may, for example, comprise indium gallium zinc oxide (e.g., IGZO), zinc oxide (e.g., ZnO), indium oxide (e.g., $In_2O_3$), tin(IV) oxide (e.g., $SnO_2$), nickel oxide (e.g., NiO), copper oxide (e.g., $Cu_2O$), copper aluminum oxide (e.g., $CuAlO_2$), copper gallium oxide (e.g., $CuGaO_2$), copper indium oxide (e.g., $CuInO_2$), strontium copper oxide (e.g., $SrCu_2O_2$), tin(II) oxide (e.g., SnO), or some other suitable material. In some embodiments, each of the channel layers 108, 110, 112 may comprise a same metal-oxide. In some other embodiments, each of the channel layers 108, 110, 112 may comprise different metal-oxides. In some embodiments, the first channel layer 108 has a first metal ratio and a corresponding first carrier concentration. In some embodiments, the second channel layer 110 has a second metal ratio, different from (e.g., less than) the first metal ratio, and a corresponding second carrier concentration, different from (e.g., less than) the first carrier concentration. In some embodiments, the third channel layer 112 has a third metal ratio, different from (e.g., less than) the first metal ratio and the second metal ratio, and a corresponding third carrier concentration, different from (e.g., less than) the first carrier concentration and the second carrier concentration.

Figure 2A:
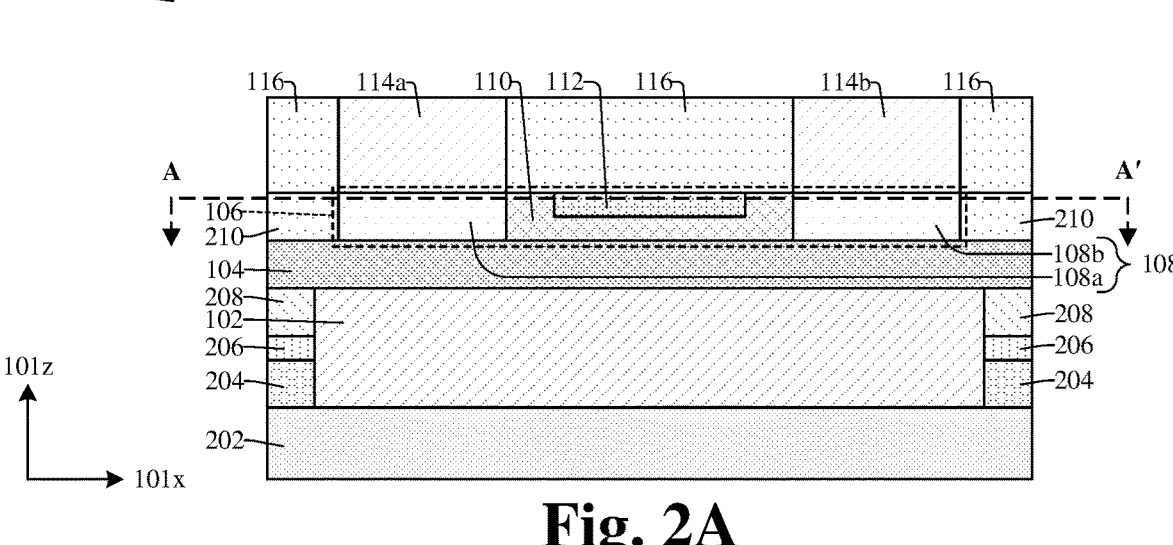
FIG. 2A illustrates a cross-sectional view of some embodiments of an integrated chip comprising the transistor device of FIG. 1.
Figures 2B, 2C:
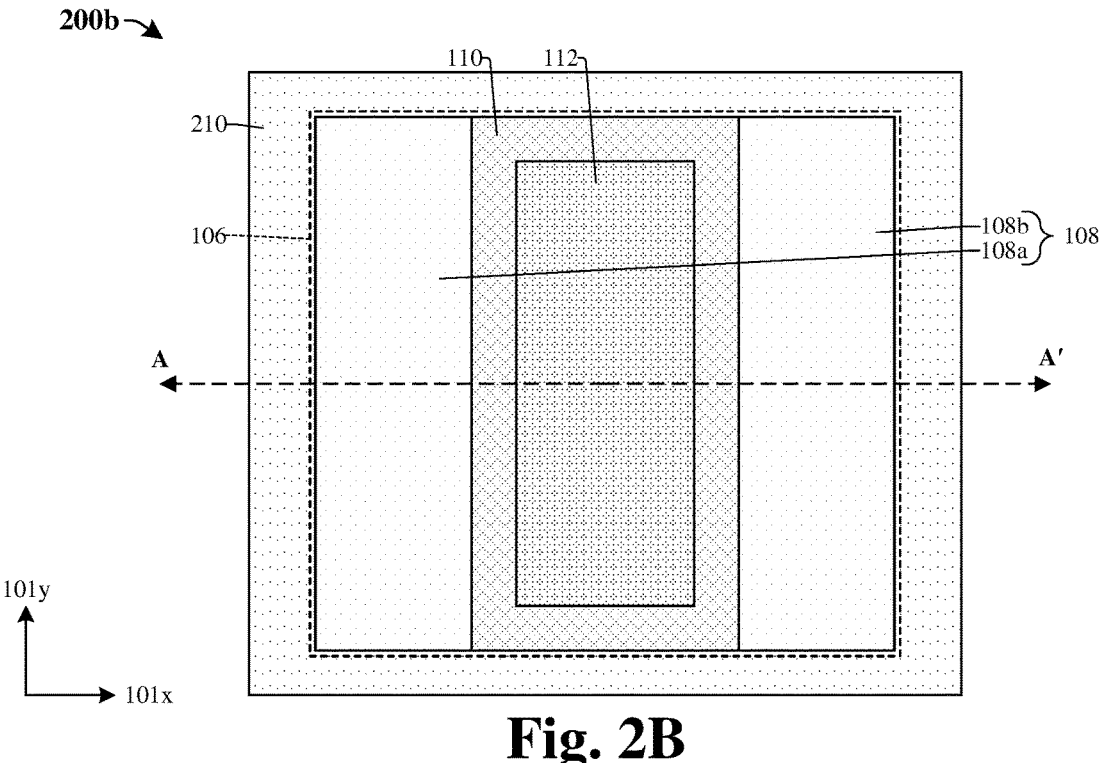
FIG. 2B illustrates a top view of some embodiments of the integrated chip of FIG. 2A.
FIG. 2C illustrates a three-dimensional view of some embodiments of the integrated chip of FIG. 2A and FIG. 2B.

FIG. 2A illustrates a cross-sectional view 200a of some embodiments of an integrated chip comprising the transistor device of FIG. 1. FIG. 2B illustrates a top view 200b of some embodiments of the integrated chip of FIG. 2A. FIG. 2C illustrates a three-dimensional view 200c of some embodiments of the integrated chip of FIG. 2A and FIG. 2B.

In some embodiments, top view 200b of FIG. 2B is taken across line A-A' of FIG. 2A. In some embodiments, cross-sectional view 200a of FIG. 2A is illustrated in an x-z plane (e.g., formed by x-axis 101x and z-axis 101z) and top view 200b of FIG. 2B is illustrated in an x-y plane (e.g., formed by x-axis 101x and y-axis 101y).

The integrated chip includes a base dielectric layer 202. In some embodiments, the base dielectric layer 202 is disposed over a semiconductor substrate (not shown). A dielectric layer 204 is over the base dielectric layer 202. A dielectric layer 206 is over dielectric layer 204. A dielectric layer 208 is over dielectric layer 206. The first gate layer 102 is over the base dielectric layer 202 and between sidewalls of dielectric layers 204, 206, 208. The insulator layer 104 extends over the first gate layer 102 and dielectric layer 208. A dielectric layer 210 is over the insulator layer 104 on opposite sides of the channel structure 106. Dielectric layer

116 is over dielectric layer 210 on opposite sides of the source/drain electrodes 114a, 114b.

Dielectric layer 210 laterally surrounds the channel structure 106 in a ring-shaped closed path. The second channel layer 110 laterally surrounds the third channel layer 112 in a ring-shaped closed path. Dielectric layer 116 laterally surrounds both of the source/drain electrodes 114a, 114b. Dielectric layer 210 and dielectric layer 116 are illustrated as being translucent in FIG. 2C for clarity of illustration.

In some embodiments, bottom surfaces of the channel segments 108a, 108b and a bottom surface of the second channel layer 110 are disposed at a first height (not labeled). Further, a bottom surface of the third channel layer 112 is disposed at a second height (not labeled), greater than the first height. Furthermore, top surfaces of the channel segments 108a, 108b, top surfaces of the second channel layer 110, and a top surface of the third channel layer 112 are disposed at a third height (not labeled), greater than the second height.

Figure 3:
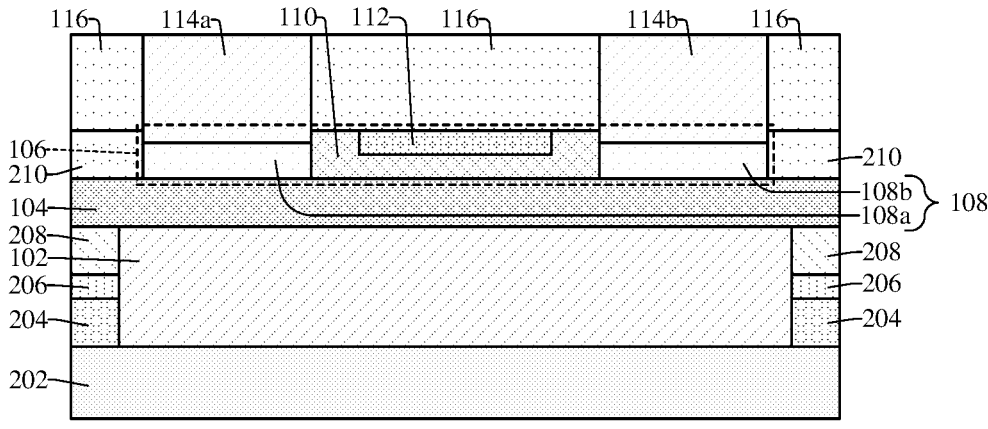
FIGS. 3-5 illustrate cross-sectional views of some other embodiments of the integrated chip of FIG. 2A.

FIG. 3 illustrates a cross-sectional view 300 of some embodiments of the integrated chip of FIG. 2A in which top surfaces of the first channel layer 108 (e.g., top surfaces of the channel segments 108a, 108b) are below top surfaces of the second channel layer 110 and the third channel layer 112.

Bottom surfaces of the source/drain electrodes 114a, 114b are below the top surfaces of the second channel layer 110 and the top surface of the third channel layer 112. Sidewalls of the source/drain electrodes 114a, 114b extend along sidewalls of the second channel layer 110. In some embodiments, the top surfaces of the first channel layer 108 are below the top surfaces of the second channel layer 110 and the third channel layer 112 due to a source/drain opening etch (e.g., as illustrated in FIG. 26) extending into the first channel layer 108 and removing portions of the channel segments 108a, 108b, thereby lowering the top surfaces of the first channel layer 108.

Figure 4:
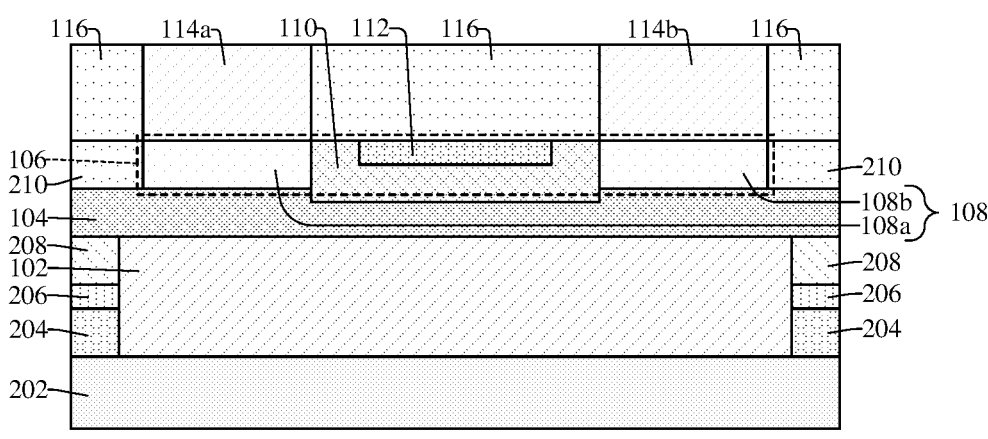

FIG. 4 illustrates a cross-sectional view 400 of some embodiments of the integrated chip of FIG. 2A in which a bottom surface of the second channel layer 110 is below bottom surfaces of the first channel layer 108 (e.g., bottom surfaces of the channel segments 108a, 108b).

The insulator layer 104 is recessed between the channel segments 108a, 108b. Thus, the bottom surface of the second channel layer 110 is below a topmost surface of the insulator layer 104 and between sidewalls of the insulator layer 104. In some embodiments, the bottom surface of the second channel layer 110 is below the bottom surfaces of the channel segments 108a, 108b due to a trench etch (e.g., as illustrated in FIG. 20) extending into the insulator layer 104 between the channel segments 108a, 108b, thereby recessing the insulator layer 104 between the channel segments 108a, 108b.

Figure 5:
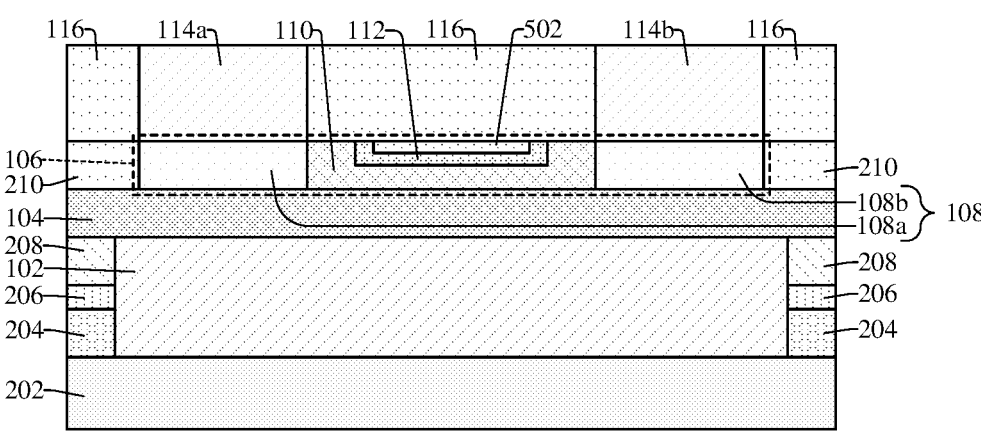

FIG. 5 illustrates a cross-sectional view 500 of some embodiments of the integrated chip of FIG. 2A in which a dielectric layer 502 is directly between the third channel layer 112 and dielectric layer 116.

Dielectric layer 502 laterally extends along an upper surface of the third channel layer 112 between sidewalls of the third channel layer 112. In some embodiments, dielectric layer 502 comprises a different dielectric than dielectric layer 116. In some embodiments, dielectric layer 502 is directly between the third channel layer 112 and dielectric layer 116 due to a planarization process performed on dielectric layer 502, the third channel layer 112, and the second channel layer 110 (e.g., as illustrated in FIG. 24) not extending downward enough to remove all of dielectric layer 502 from over the third channel layer 112.

Figure 6A:
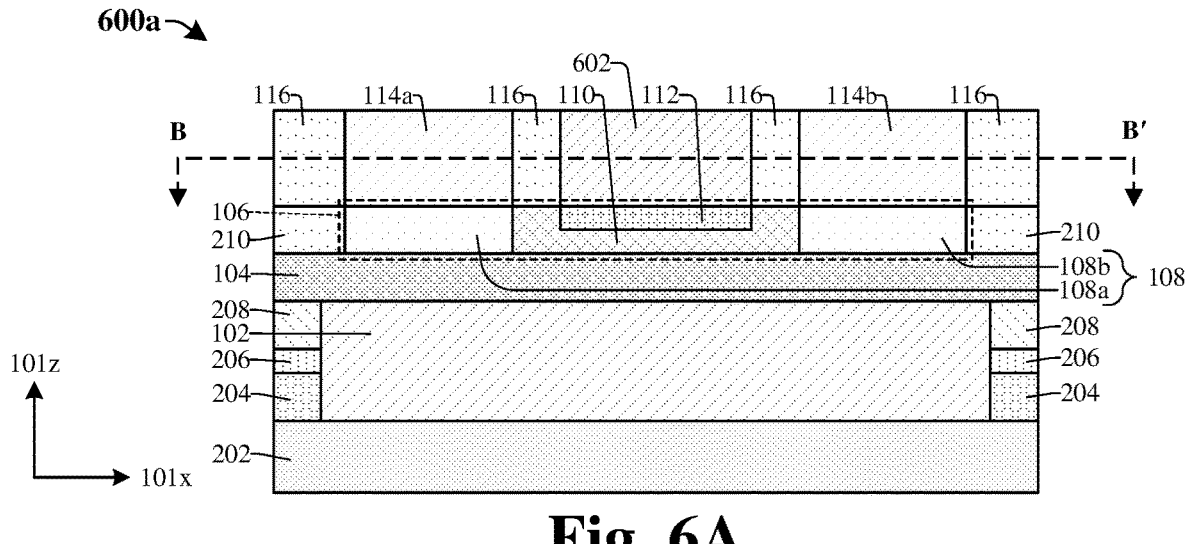
FIG. 6A illustrates a cross-sectional view of some embodiments of the integrated chip of FIG. 2 in which a second gate layer is between the pair of source/drain electrodes.
Figure 6B:
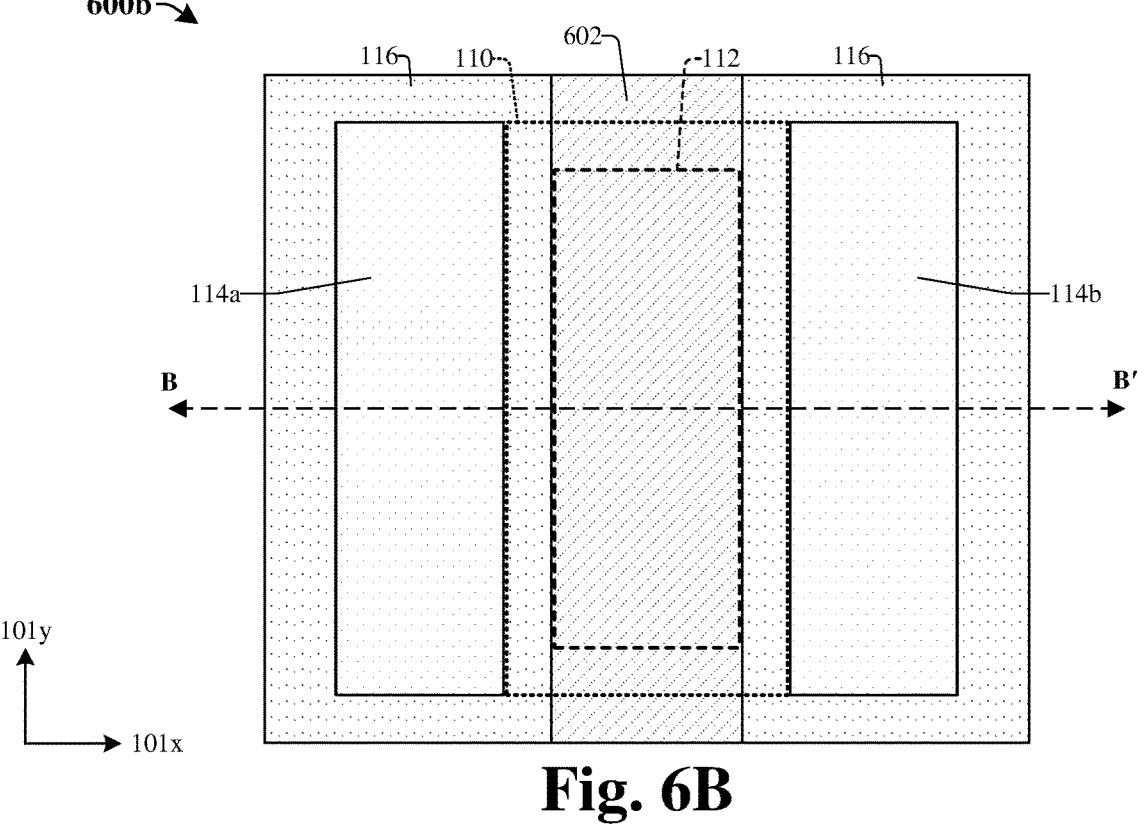
FIG. 6B illustrates a top view of some embodiments of the integrated chip of FIG. 6A.

FIG. 6A illustrates a cross-sectional view 600a of some embodiments of the integrated chip of FIG. 2 in which a second gate layer 602 is directly over the channel structure 106 and directly between the source/drain electrodes 114a, 114b. FIG. 6B illustrates a top view 600b of some embodiments of the integrated chip of FIG. 6A. In some embodiments, top view 600b of FIG. 6B is taken across line B-B' of FIG. 6A.

The second gate layer 602 can improve the control of the threshold voltage of the transistor device. For example, the second gate layer 602 can be biased individually (e.g., the voltage at the second gate layer 602 can be controlled separately from the voltage at the first gate layer 102) to further tune the threshold voltage of the transistor device. Thus, a performance of the transistor device may be further improved by including the second gate layer 602 over the channel structure 106.

Figure 7:
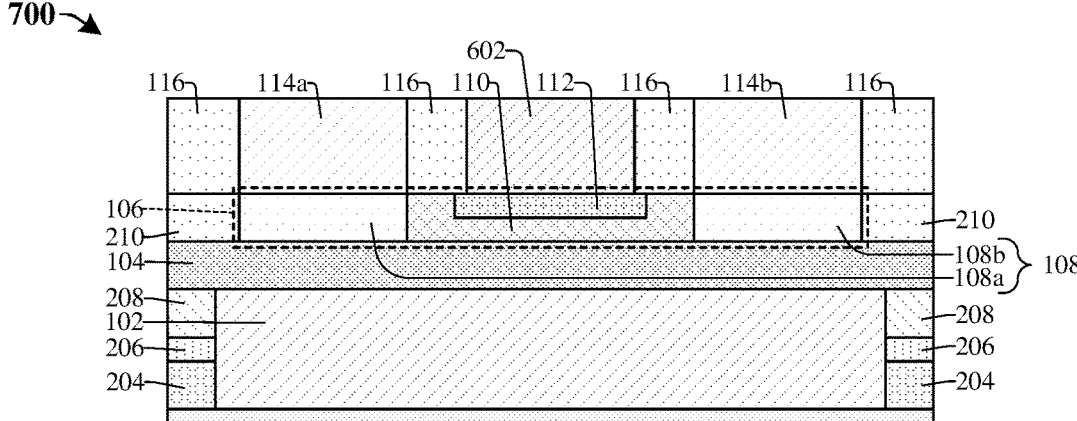
FIGS. 7-10 illustrate cross-sectional views of some other embodiments of the integrated chip of FIG. 6A.
Figure 8:
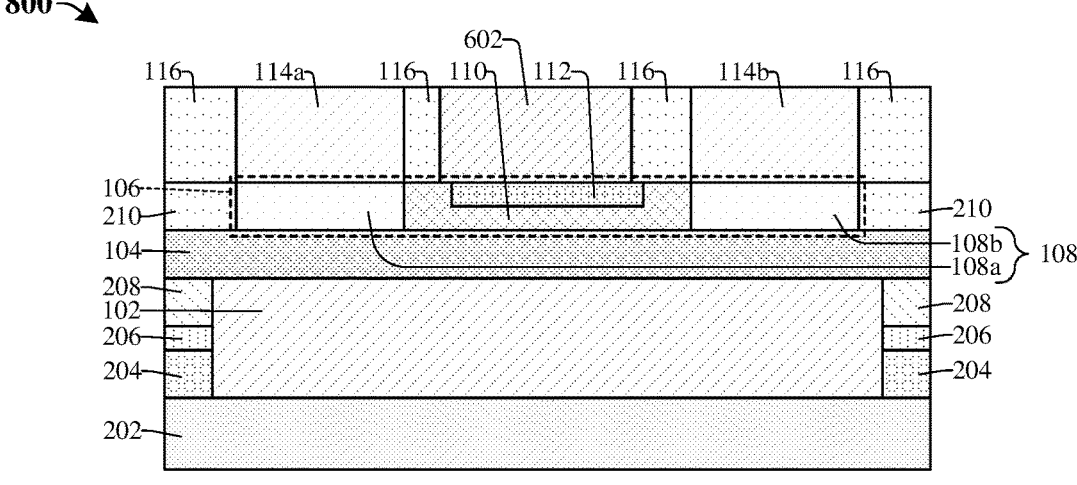
Figure 9:
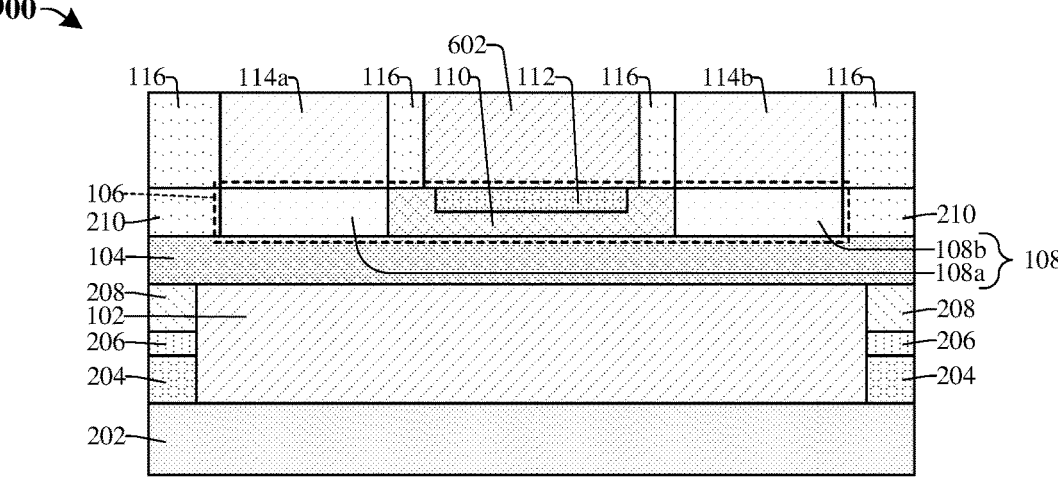

The second gate layer 602 is vertically spaced apart from an upper surface of the second channel layer 110 by the third channel layer 112. In some embodiments, sidewalls of the second gate layer 602 are aligned with outer sidewalls of the third channel layer 112 and inner sidewalls of the second channel layer 110. In some other embodiments (e.g., as illustrated in FIGS. 7-9), the sidewalls of the second gate layer 602 are laterally offset from the outer sidewalls of the third channel layer 112 and the inner sidewalls of the second channel layer 110. In some embodiments, the second gate layer 602 extends in length (e.g., along the y-axis 101y) beyond ends of the source/drain electrodes 114a, 114b. In some other embodiments (not shown), the second gate layer 602 has a same length (e.g., along the y-axis 101y) as the source/drain electrodes 114a, 114b. In some embodiments, the second gate layer 602 may alternatively be referred to as a second gate electrode.

FIGS. 7-9 illustrate cross-sectional views 700-900 of some embodiments of the integrated chip of FIG. 6A in which sidewalls of the second gate layer 602 are laterally offset from sidewalls of the third channel layer 112.

In some embodiments (e.g., as illustrated in FIG. 7), the second gate layer 602 is narrower than the third channel layer 112 and the sidewalls of the second gate layer 602 are directly over a top surface of the third channel layer 112. In some embodiments (e.g., as illustrated in FIG. 8), one sidewall of the second gate layer 602 is directly over a top surface of the second channel layer 110 and another sidewall of the second gate layer 602 is directly over the top surface of the third channel layer 112. In some embodiments (e.g., as illustrated in FIG. 8), the second gate layer 602 is wider than the third channel layer 112 and the sidewalls of the second gate layer 602 are directly over top surfaces of the second channel layer 110.

Figure 10:
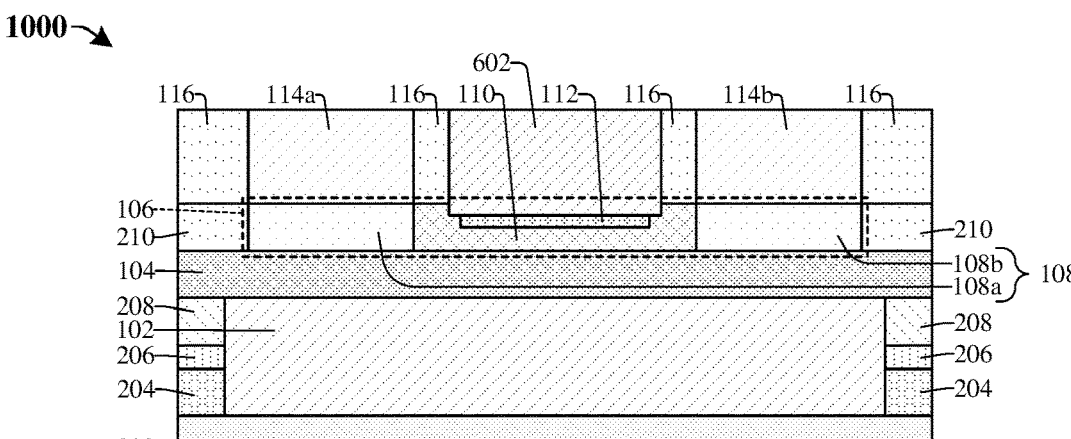

FIG. 10 illustrates a cross-sectional view 1000 of some embodiments of the integrated chip of FIG. 6A in which a bottom surface of the second gate layer 602 is below topmost surfaces of the second channel layer 110.

The third channel layer 112 and/or the second channel layer 110 are recessed. In some embodiments, this arrangement of the second gate layer 602 is due to a second gate etch (e.g., as illustrated in FIG. 28) extending into the third channel layer 112 and/or the second channel layer 110. In some embodiments, sidewalls of second gate layer 602 extend along sidewalls of second channel layer 110 and/or sidewalls of the third channel layer 112.

Figure 11:
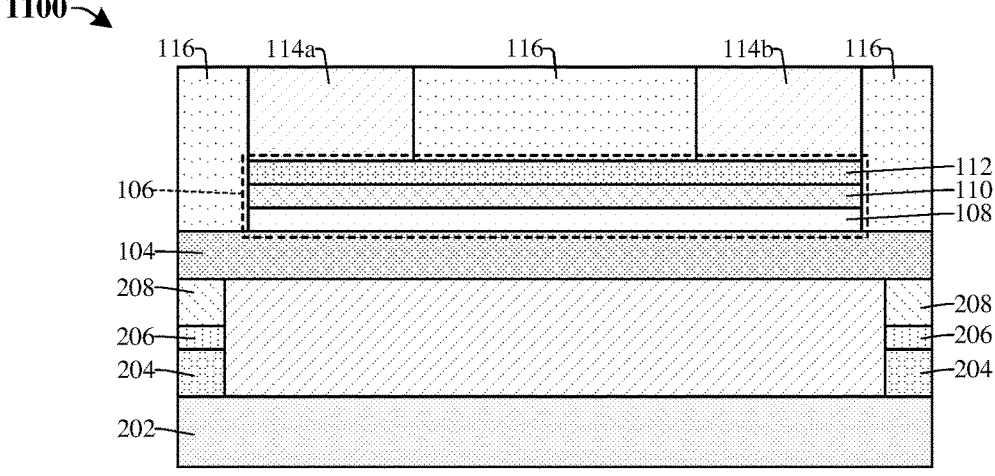
FIG. 11 illustrates a cross-sectional view of some embodiments of the integrated chip of FIG. 2A in which the channel layers are stacked.
Figure 12:
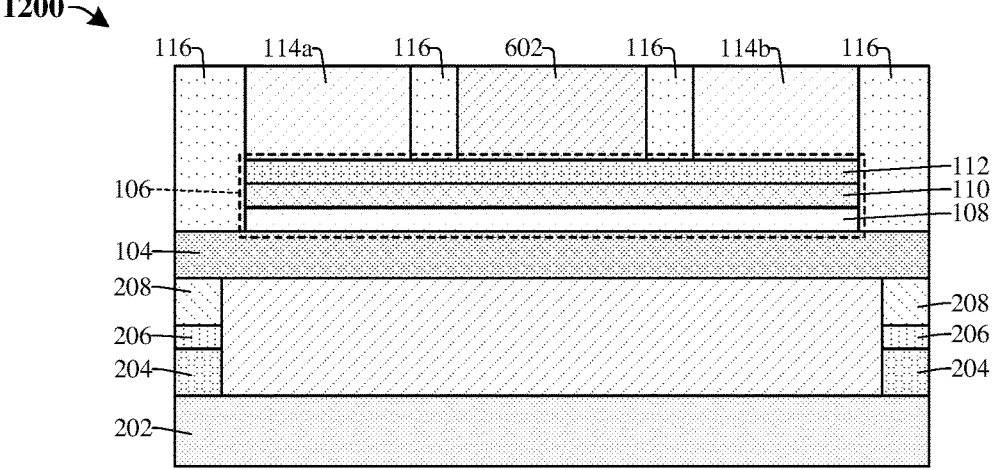
FIG. 12 illustrates a cross-sectional view of some embodiments of the integrated chip of FIG. 6A in which the channel layers are stacked.

FIG. 11 illustrates a cross-sectional view 1100 of some embodiments of the integrated chip of FIG. 2A in which the channel structure 106 comprises a stack of channel layers 108, 110, 112. FIG. 12 illustrates a cross-sectional view

1200 of some embodiments of the integrated chip of FIG. 6A in which the channel structure 106 comprises a stack of channel layers 108, 110, 112.

For example, the first channel layer 108 extends continuously along a top surface of the insulator layer 104 from directly below the first source/drain electrode 114a to directly below the second source/drain electrode 114b. The second channel layer 110 is directly over the first channel layer 108 and the third channel layer 112 is directly over the second channel layer 110. In some embodiments (e.g., as illustrated in FIG. 12), the second gate layer 602 is directly over the first channel layer 108, the second channel layer 110, and the third channel layer 112.

By stacking the channel layers 108, 110, 112, the carrier concentration of the channel structure 106 can be tuned. For example, by controlling the carrier concentrations and thicknesses of the individual channel layers 108, 110, 112, the carrier concentration of the channel structure 106 at different depths of the channel structure 106 can be tuned. As a result, a performance of the transistor device may be tuned.

FIGS. 13A-29A illustrate cross-sectional views 1300a-2900a and FIGS. 13B-29B illustrate corresponding three-dimensional views 1300b-2900b, respectively, of some embodiments of a method for forming a transistor device comprising a plurality of channel layers 108, 110, 112 between a first gate layer 102 and a pair of source/drain electrodes 114a, 114b. Although FIGS. 13A, 13B through FIGS. 29A, 29B are described in relation to a method, it will be appreciated that the structures disclosed in FIGS. 13A, 13B through FIGS. 29A, 29B are not limited to such a method, but instead may stand alone as structures independent of the method.

Figure 13A:
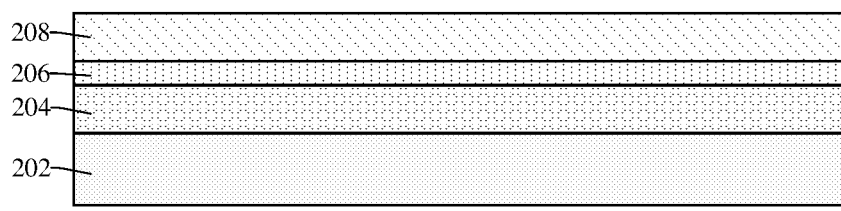
Figure 13B:
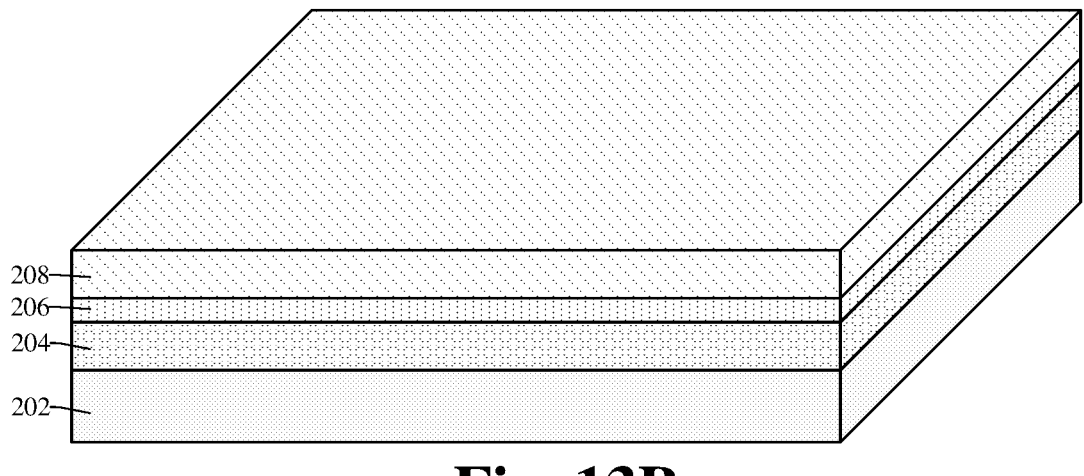

As shown in cross-sectional view 1300a of FIG. 13A and corresponding three-dimensional view 1300b of FIG. 13B, a dielectric layer 204 is deposited over a base dielectric layer 202. A dielectric layer 206 is deposited over dielectric layer 204. A dielectric layer 208 is deposited over dielectric layer 206. In some embodiments, the base dielectric layer 202 comprises a low-k dielectric (e.g., a dielectric having a dielectric constant less than that of silicon dioxide) or some other suitable material. In some embodiments, dielectric layer 204 comprises silicon nitride or some other suitable material. In some embodiments, dielectric layer 206 comprises aluminum oxide or some other suitable material. In some embodiments, dielectric layer 208 comprises silicon dioxide or some other suitable material. In some embodiments, any of layers 204, 206, 208 can be deposited by a chemical vapor deposition (CVD) process, a physical vapor deposition (PVD) process, an atomic layer deposition (ALD) process, or some other suitable process.

Figure 14A:
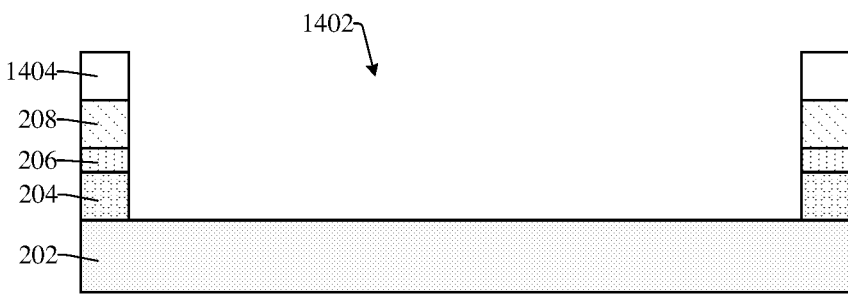
Figure 14B:
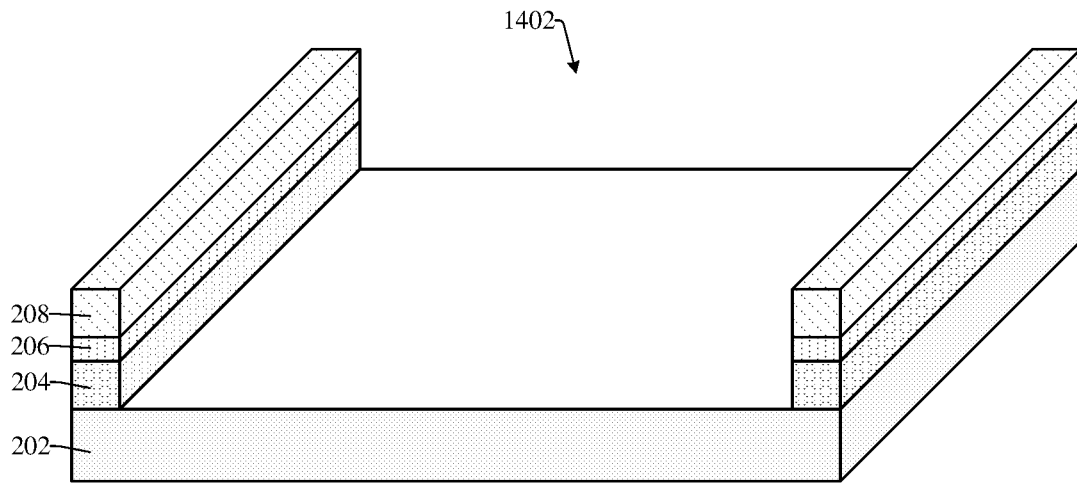

As shown in cross-sectional view 1400a of FIG. 14A and corresponding three-dimensional view 1400b of FIG. 14B, dielectric layer 208, dielectric layer 206, and dielectric layer 204 are etched to form a first gate opening 1402 in dielectric layer 208, dielectric layer 206, and dielectric layer 204. In some embodiments, a masking layer 1404 is formed over dielectric layer 208 and the etching is performed according to the masking layer 1404. In some embodiments, the etching comprises a dry etching process (e.g., a plasma etching process, a reactive ion etching (RIE) process, an ion beam etching (IBE) process, or the like) or some other suitable etching process. In some embodiments, the masking layer 1404 comprises a photoresist layer, a hard mask layer, or some other suitable layer. In some embodiments, the masking layer 1404 is removed during and/or after the etching. Masking layer 1404 is not shown in FIG. 14B for simplicity and clarity of illustration.

Figure 15A:
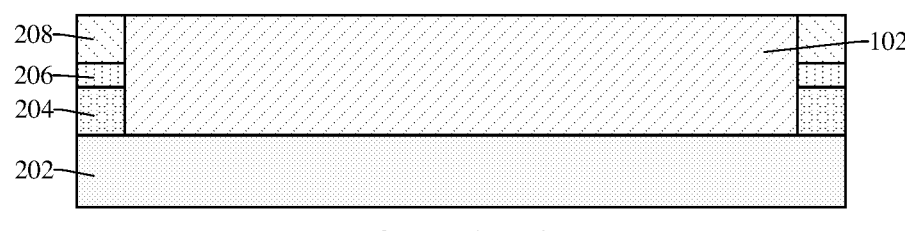
Figure 15B:
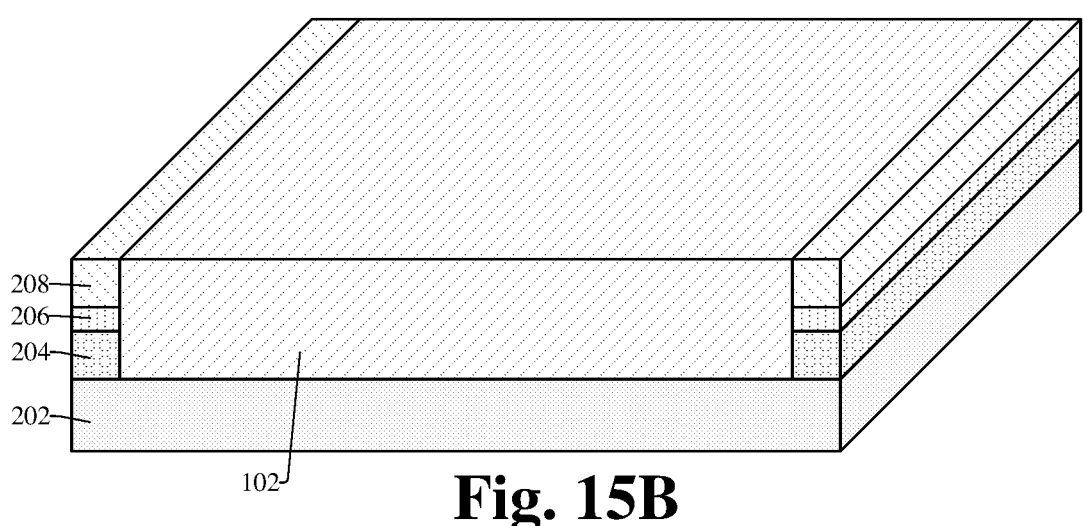

As shown in cross-sectional view 1500a of FIG. 15A and corresponding three-dimensional view 1500b of FIG. 15B, a first gate layer 102 is deposited over the base dielectric layer 202 in the first gate layer opening 1402. In some embodiments, the first gate layer 102 comprises tungsten or some other suitable material. In some embodiments, the first gate layer 102 is deposited by a CVD process, a PVD process, an ALD process, or some other suitable process. In some embodiments, a planarization process (e.g., a chemical mechanical planarization (CMP) or the like) is performed on the first gate layer 102 to delimit the first gate layer 102 after the deposition.

Figure 16A:
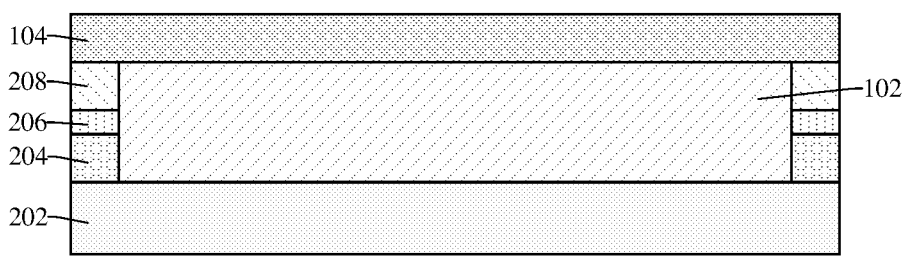
Figure 16B:
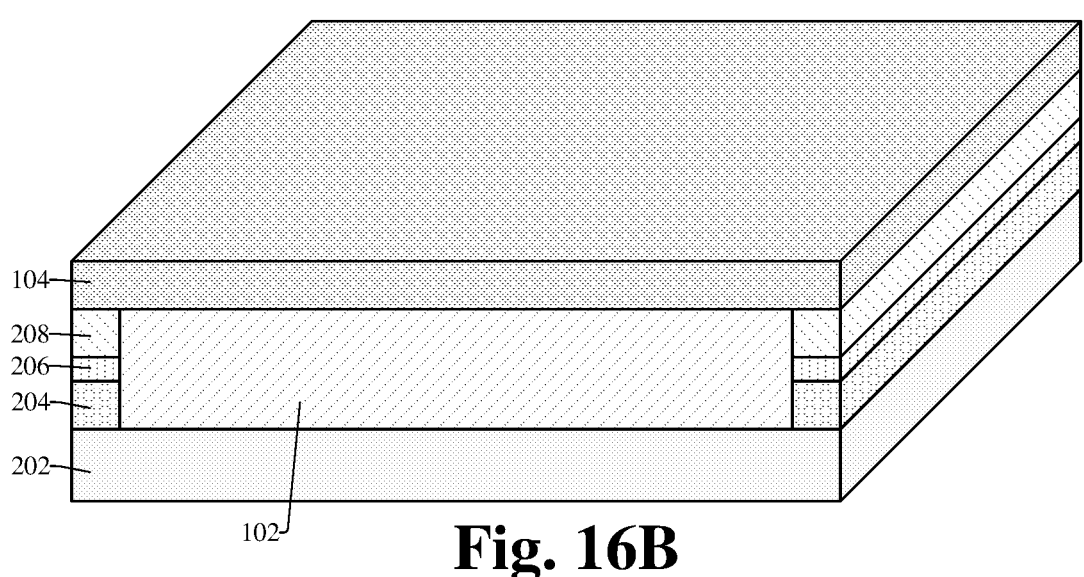

As shown in cross-sectional view 1600a of FIG. 16A and corresponding three-dimensional view 1600b of FIG. 16B, an insulator layer 104 is deposited over the first gate layer 102 and over dielectric layer 208. In some embodiments, the insulator layer 104 comprises a high-k dielectric (e.g., hafnium oxide, aluminum oxide, or some other suitable material). In some other embodiments, the insulator layer 104 comprises a ferroelectric (e.g., hafnium zirconium oxide or some other suitable material). In some embodiments, the insulator layer 104 is deposited by a CVD process, a PVD process, an ALD process, or some other suitable process.

Figure 17A:
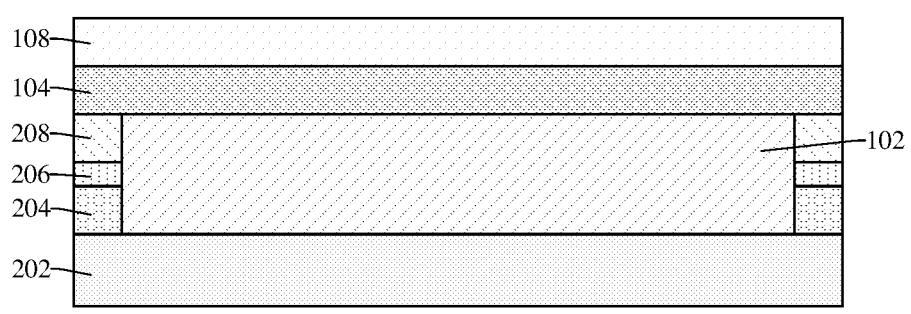
Figure 17B:
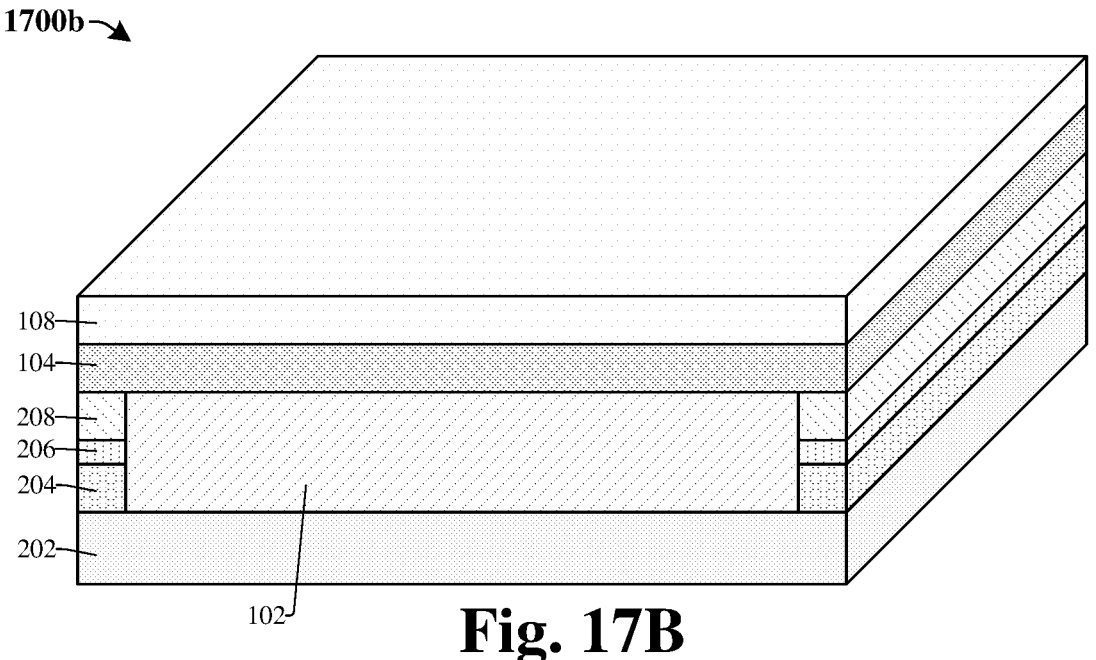

As shown in cross-sectional view 1700a of FIG. 17A and corresponding three-dimensional view 1700b of FIG. 17B, a first channel layer 108 is deposited over the insulator layer 104. In some embodiments, the first channel layer 108 comprises a first metal-oxide semiconductor (e.g., indium gallium zinc oxide (e.g., IGZO), zinc oxide (e.g., ZnO), indium oxide (e.g., $In_2O_3$), tin(IV) oxide (e.g., $SnO_2$), nickel oxide (e.g., NiO), copper oxide (e.g., $Cu_2O$), copper aluminum oxide (e.g., $CuAlO_2$), copper gallium oxide (e.g., $CuGaO_2$), copper indium oxide (e.g., $CuInO_2$), strontium copper oxide (e.g., $SrCu_2O_2$), tin(II) oxide (e.g., SnO), or some other suitable material) having a first carrier concentration (e.g., a first metal ratio). In some embodiments, the first carrier concentration is controlled by controlling the metal ratio of the metal-oxide semiconductor (e.g., the first metal ratio). For example, increasing the metal ratio of the first metal-oxide semiconductor (e.g., the first metal ratio) increases the first carrier concentration. Conversely, reducing the metal ratio of the first metal-oxide semiconductor (e.g., the first metal ratio) reduces the first carrier concentration. Thus, by controlling the metal ratio of the metal-oxide semiconductor of the first channel layer 108, the carrier concentration of the first channel layer 108 can be tuned. In some embodiments, the first channel layer 108 is deposited by a CVD process, a PVD process, an ALD process, or some other suitable process.

Figure 18A:
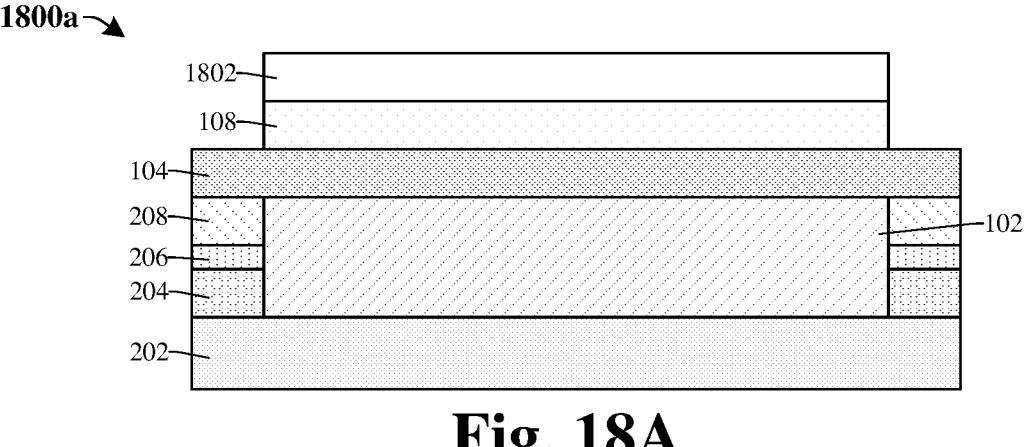
Figure 18B:
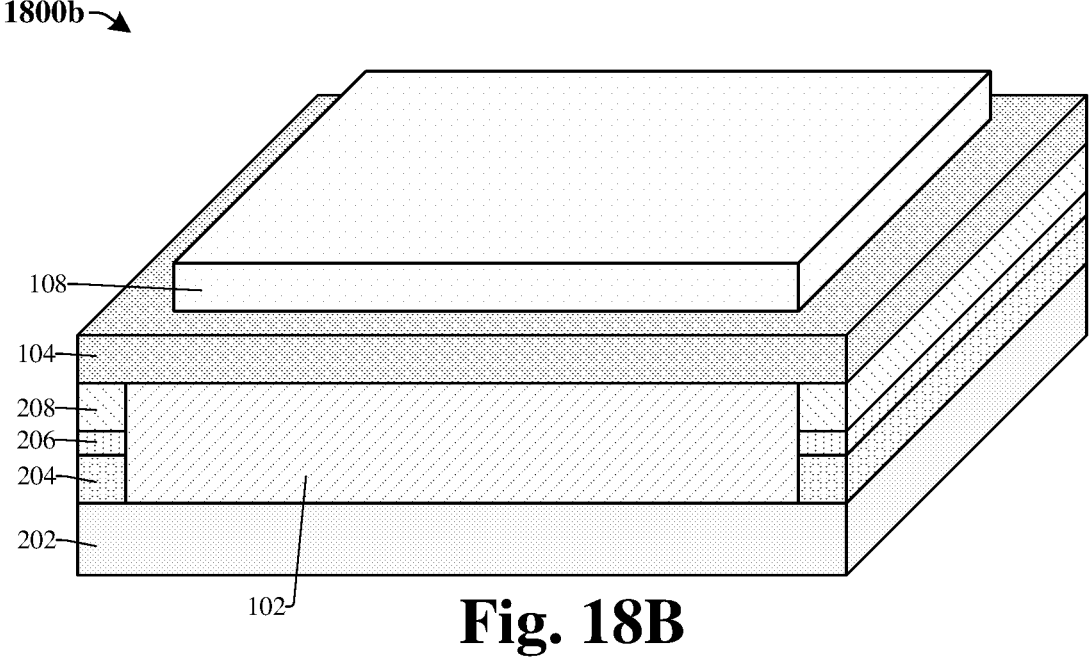

As shown in cross-sectional view 1800a of FIG. 18A and corresponding three-dimensional view 1800b of FIG. 18B, the first channel layer 108 is etched along a periphery of the first channel layer 108 to remove a peripheral portion of the first channel layer 108 from over a peripheral portion of the insulator layer 104. In some embodiments, a masking layer 1802 is formed over the first channel layer 108 and the etching is performed according to the masking layer 1802. In some embodiments, the etching comprises a dry etching process or some other suitable etching process. In some embodiments, the masking layer 1802 comprises a photoresist layer, a hard mask layer (e.g., a dielectric hard mask), or some other suitable layer. In some embodiments, the masking layer 1802 is removed during and/or after the etching. Masking layer 1802 is not shown in FIG. 18B for simplicity and clarity of illustration.

Figure 19A:
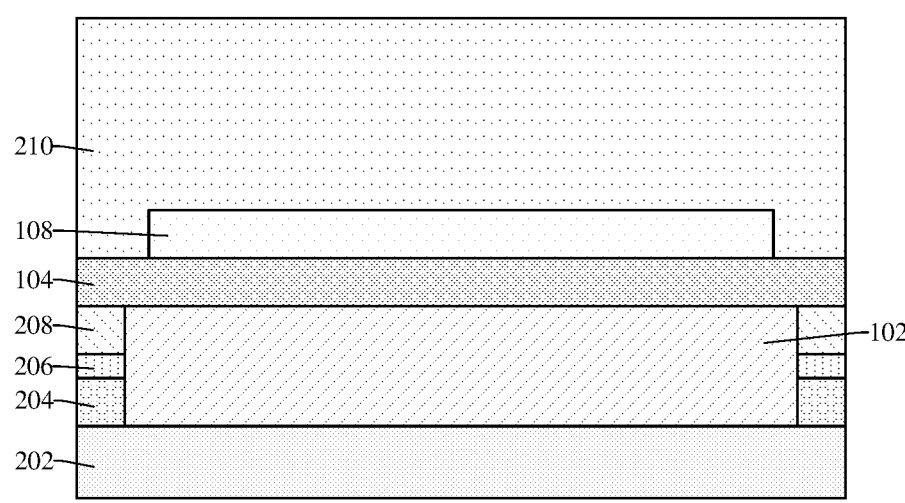
Figure 19B:
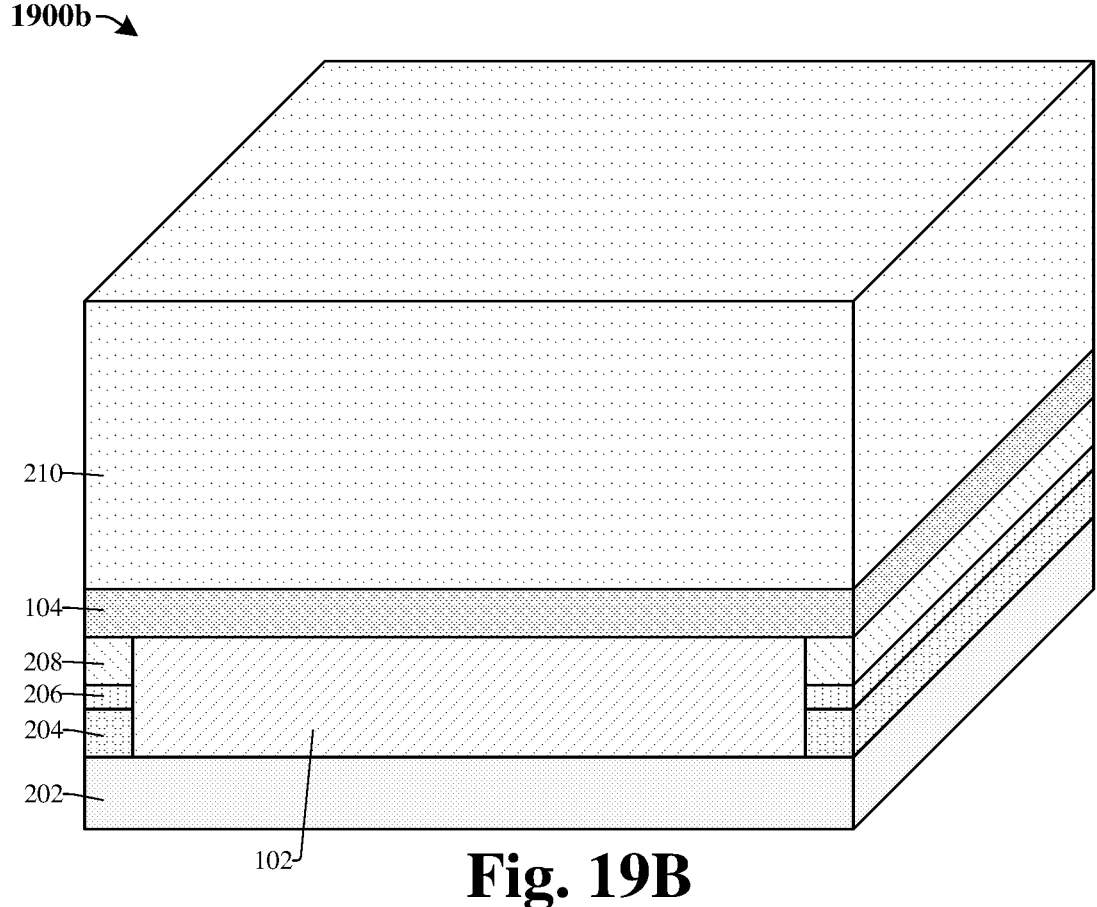

As shown in cross-sectional view 1900a of FIG. 19A and corresponding three-dimensional view 1900b of FIG. 19B, a dielectric layer 210 is deposited over the first channel layer 108, along sidewalls of the first channel layer 108, and over the insulator layer 104. In some embodiments, dielectric layer 210 comprises a silicon dioxide or some other suitable material. In some embodiments, dielectric layer 210 is deposited by a CVD process, a PVD process, an ALD process, or some other suitable process.

Figure 20A:
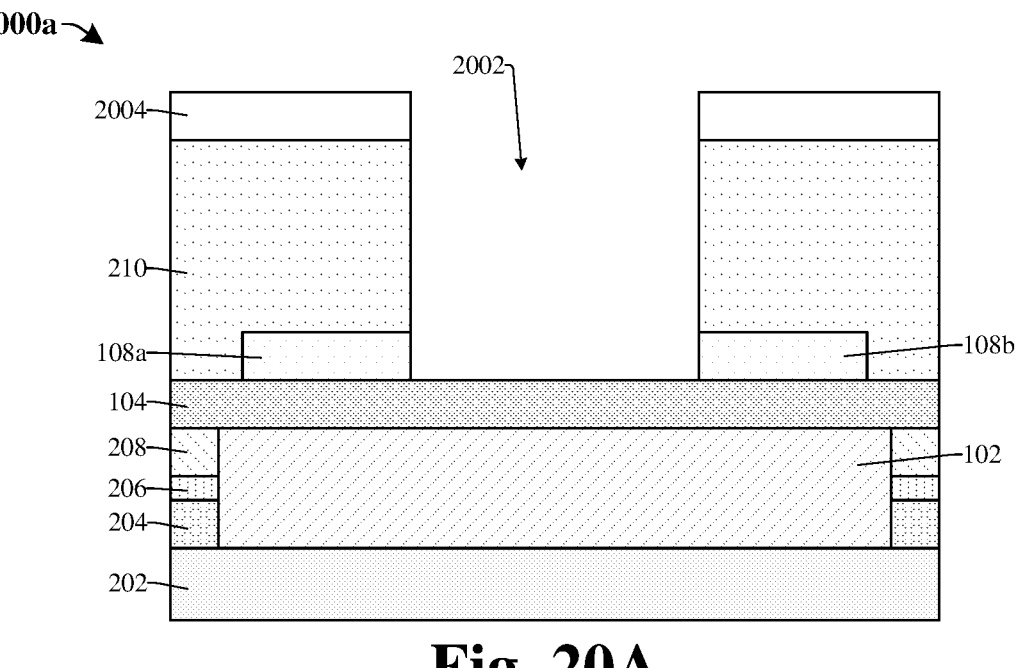
Figure 20B:
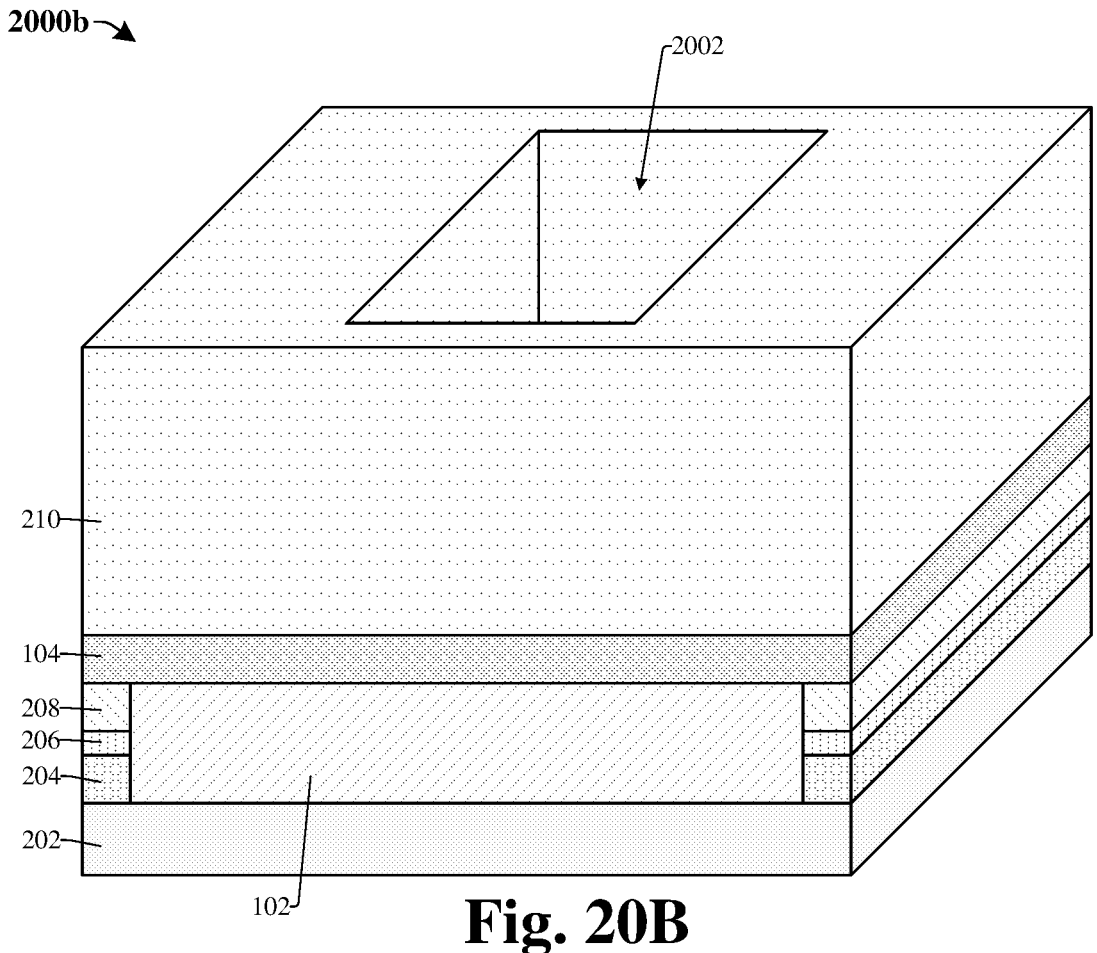

As shown in cross-sectional view 2000a of FIG. 20A and corresponding three-dimensional view 2000b of FIG. 20B, dielectric layer 210 and the first channel layer 108 are etched to form a trench 2002 in dielectric layer 210 and the first channel layer 108. The trench 2002 extends through dielectric layer 210 and through the first channel layer 108 to a top surface of the insulator layer 104. The trench 2002 is delimited by sidewalls of dielectric layer 210, sidewalls of the first channel layer 108, and an upper surface of the insulator layer 104. The etching forms a pair of channel segments 108a, 108b from the first channel layer 108.

In some embodiments, a masking layer 2004 is formed over dielectric layer 210 and the etching is performed according to the masking layer 2004. In some embodiments, the etching comprises a dry etching process or some other suitable etching process. In some embodiments, the masking layer 2004 comprises a photoresist layer, a hard mask layer, or some other suitable layer. In some embodiments, the masking layer 2004 is removed during and/or after the etching. Masking layer 2004 is not shown in FIG. 20B for simplicity and clarity of illustration.

In some embodiments, the trench 2002 extends slightly into the insulator layer 104. As a result, a recess is formed in the top surface of the insulator layer 104 (e.g., as shown in FIG. 4).

Figure 21A:
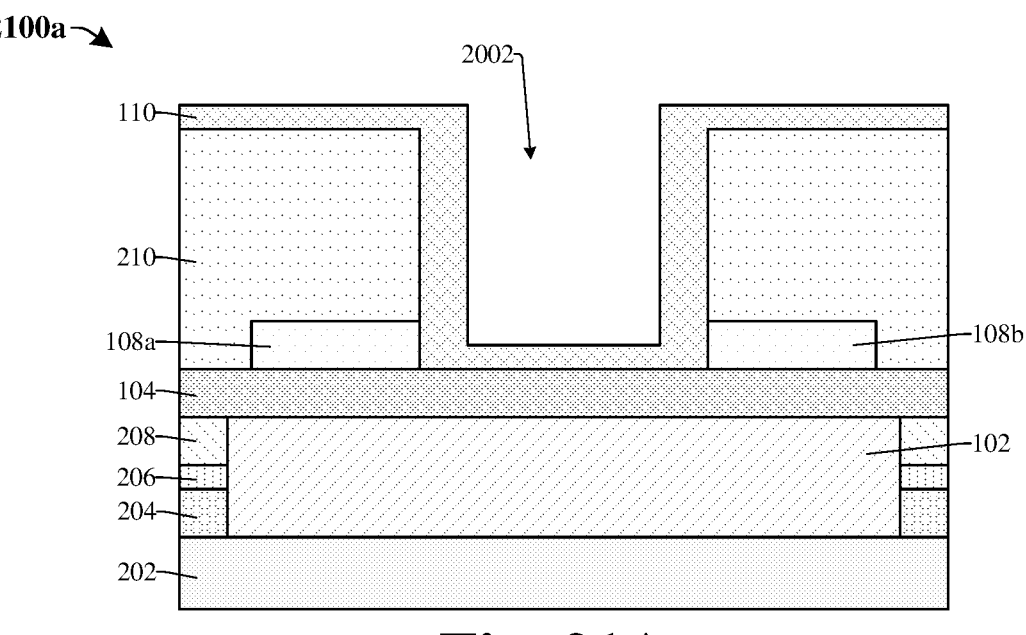
Figure 21B:
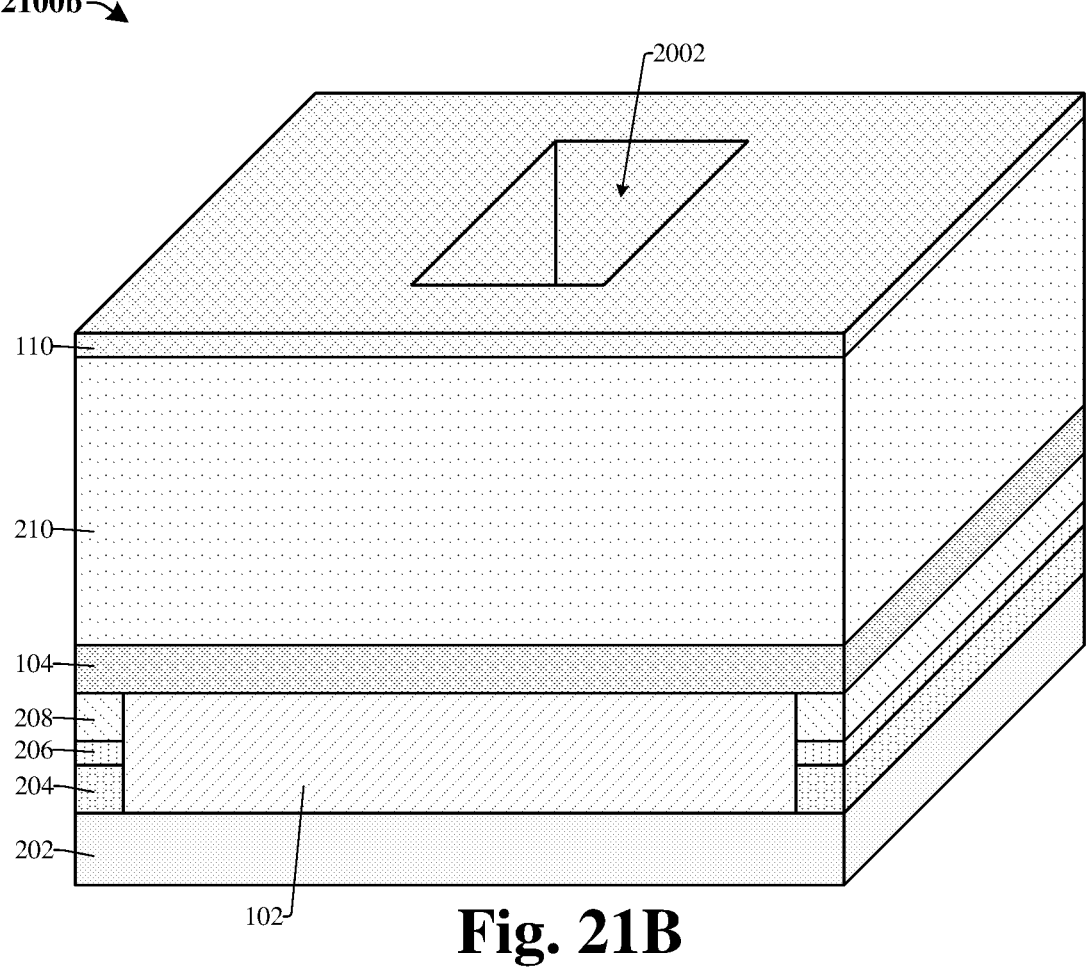

As shown in cross-sectional view 2100a of FIG. 21A and corresponding three-dimensional view 2100b of FIG. 21B, a second channel layer 110 is deposited over dielectric layer 210 and in the trench 2002. For example, the second channel layer 110 is deposited on sidewalls of dielectric layer 210, sidewalls of the channel segments 108a, 108b, and the top surface of the insulator layer 104. In some embodiments, the second channel layer 110 comprises a second metal-oxide semiconductor (e.g., indium gallium zinc oxide (e.g., IGZO), zinc oxide (e.g., ZnO), indium oxide (e.g., $In_2O_3$), tin(IV) oxide (e.g., $SnO_2$), nickel oxide (e.g., NiO), copper oxide (e.g., $Cu_2O$), copper aluminum oxide (e.g., $CuAlO_2$), copper gallium oxide (e.g., $CuGaO_2$), copper indium oxide (e.g., $CuInO_2$), strontium copper oxide (e.g., $SrCu_2O_2$), tin(II) oxide (e.g., SnO), or some other suitable material) having a second carrier concentration (e.g., a second metal ratio), less than the first carrier concentration. In some embodiments, the carrier concentration of the second channel layer 110 can be controlled by controlling a metal ratio of the metal-oxide semiconductor of the second channel layer 110. In some embodiments, the second channel layer 110 is deposited by a CVD process, a PVD process, an ALD process, or some other suitable process.

Figure 22A:
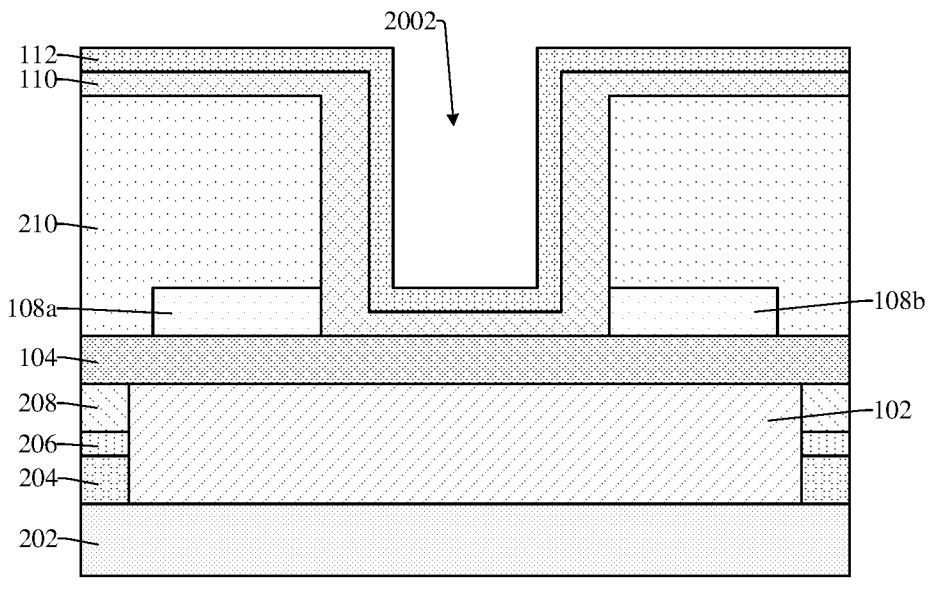
Figure 22B:
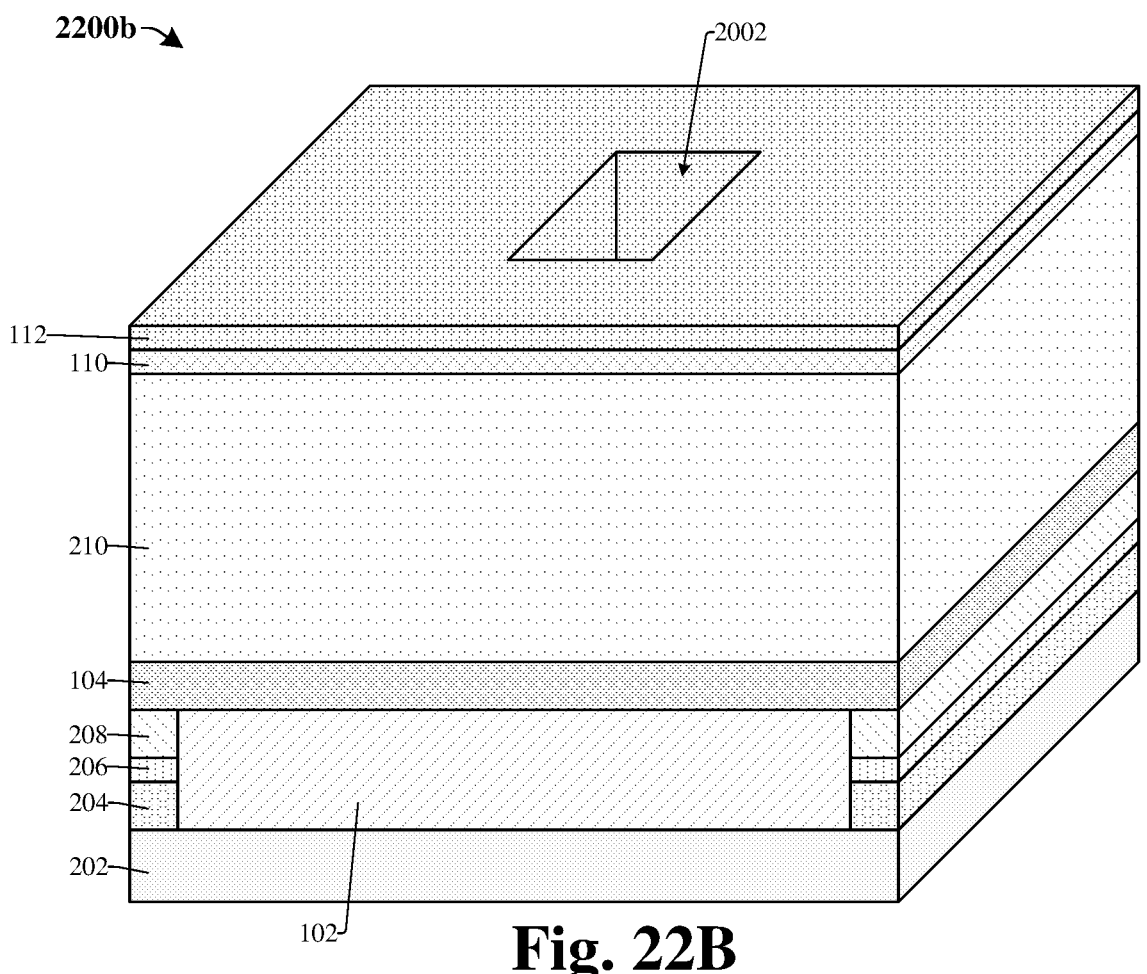

As shown in cross-sectional view 2200a of FIG. 22A and corresponding three-dimensional view 2200b of FIG. 22B, a third channel layer 112 is deposited over the second channel layer 110 and in the trench 2002. For example, the third channel layer 112 is deposited on sidewalls and upper surfaces of the second channel layer 110. In some embodiments, the third channel layer 112 comprises a third metal-oxide semiconductor (e.g., indium gallium zinc oxide (e.g., IGZO), zinc oxide (e.g., ZnO), indium oxide (e.g., $In_2O_3$), tin(IV) oxide (e.g., $SnO_2$), nickel oxide (e.g., NiO), copper oxide (e.g., $Cu_2O$), copper aluminum oxide (e.g., $CuAlO_2$), copper gallium oxide (e.g., $CuGaO_2$), copper indium oxide (e.g., $CuInO_2$), strontium copper oxide (e.g., $SrCu_2O_2$), tin(II) oxide (e.g., SnO), or some other suitable material) having a third carrier concentration (e.g., a third metal ratio), less than the second carrier concentration. In some embodiments, the carrier concentration of the third channel layer 112 can be controlled by controlling a metal ratio of the metal-oxide semiconductor of the third channel layer 112. In some embodiments, the third channel layer 112 is deposited by a CVD process, a PVD process, an ALD process, or some other suitable process.

Figures 23A, 23B:
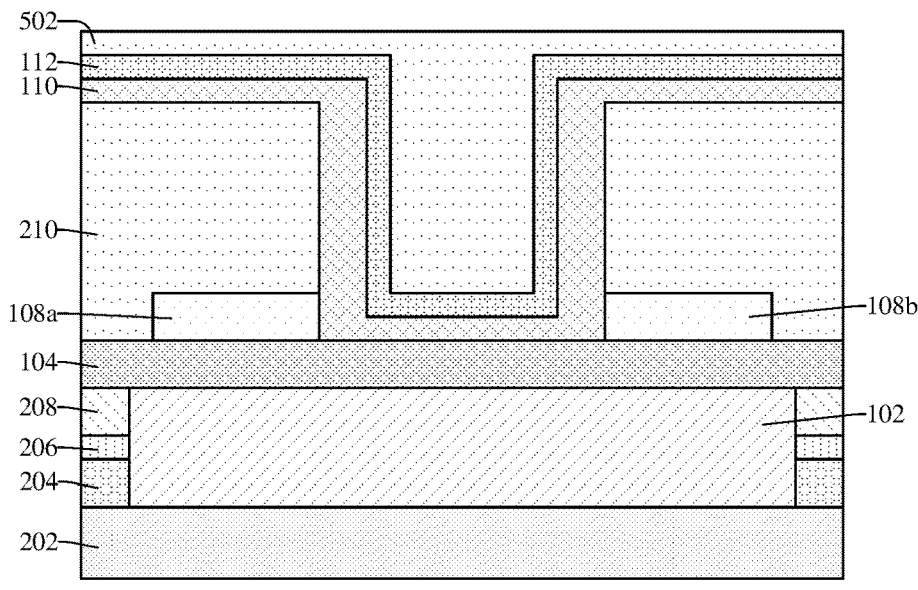

As shown in cross-sectional view 2300a of FIG. 23A and corresponding three-dimensional view 2300b of FIG. 23B, a dielectric layer 502 is deposited over the third channel layer 112 and in the trench (e.g., 2002 of FIGS. 22A, 22B). For example, in some embodiments, dielectric layer 502 is deposited on sidewalls and upper surfaces of the third channel layer 112. In some embodiments, dielectric layer 502 fills the trench (e.g., 2002 of FIGS. 22A, 22B). In some embodiments, a bottom surface of dielectric layer 502 is below a top surface of the first channel layer 108 (e.g., as illustrated in FIG. 5). In some embodiments, dielectric layer 502 comprises silicon dioxide or some other suitable material. In some embodiments, the dielectric layer 502 is deposited by a CVD process, a PVD process, an ALD process, or some other suitable process.

Figure 24A:
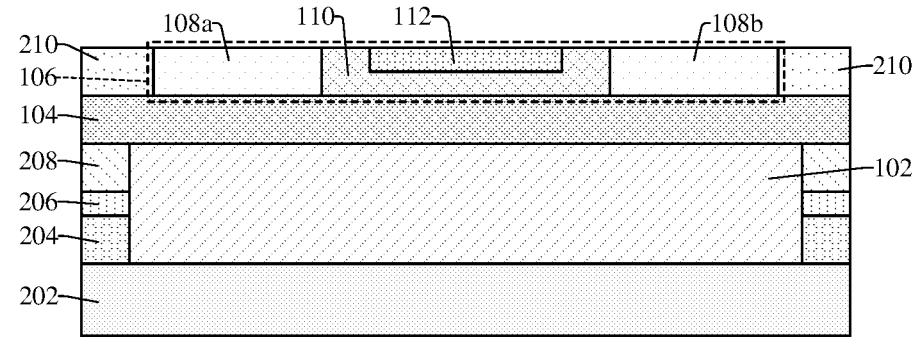
Figure 24B:
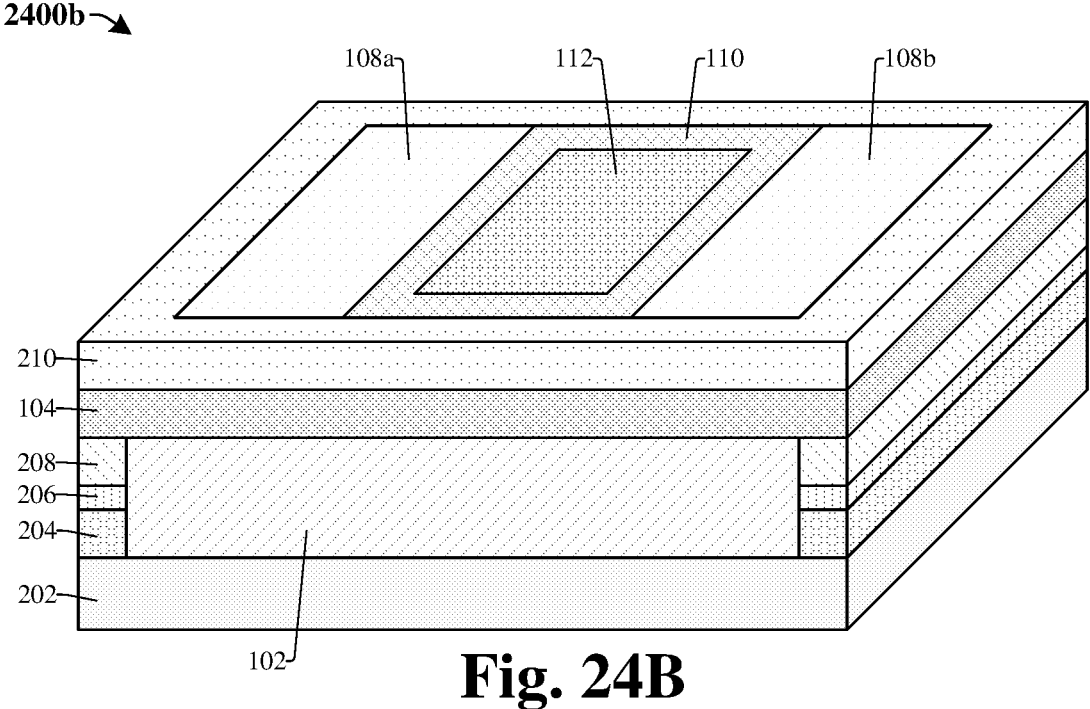

As shown in cross-sectional view 2400a of FIG. 24A and corresponding three-dimensional view 2400b of FIG. 24B, a planarization process is performed on dielectric layer 502, the third channel layer 112, the second channel layer 110, and dielectric layer 210 to delimit the channel structure 106. The planarization removes dielectric layer 502, the third channel layer 112, the second channel layer 110, and dielectric layer 210 from above a top surface of the first channel layer 108. The planarization delimits the second channel layer 110 and the third channel layer 112. In some embodiments, top surfaces of dielectric layer 210, the first channel layer 108, the second channel layer 110, and the third channel layer 112 are approximately coplanar as a result of the planarization process. In some embodiments, the planarization process is also performed on the first channel layer 108 (e.g., the first channel segment 108a and the second channel segment 108b). In some embodiments, the planarization process comprises a chemical mechanical planarization (CMP) or some other suitable process.

In some embodiments, a portion of dielectric layer 502 is not removed from over the third channel layer 112. As a result, the portion of dielectric layer 502 remains over the third channel layer 112 (e.g., as illustrated in FIG. 5).

Figure 25A:
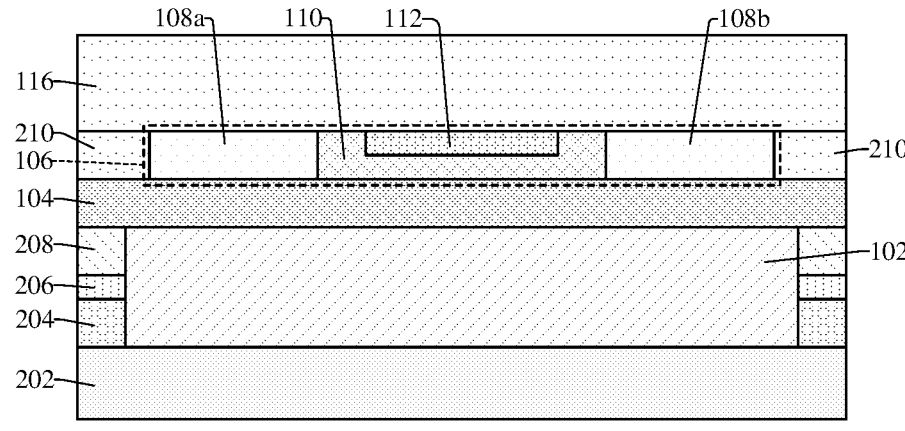
Figure 25B:
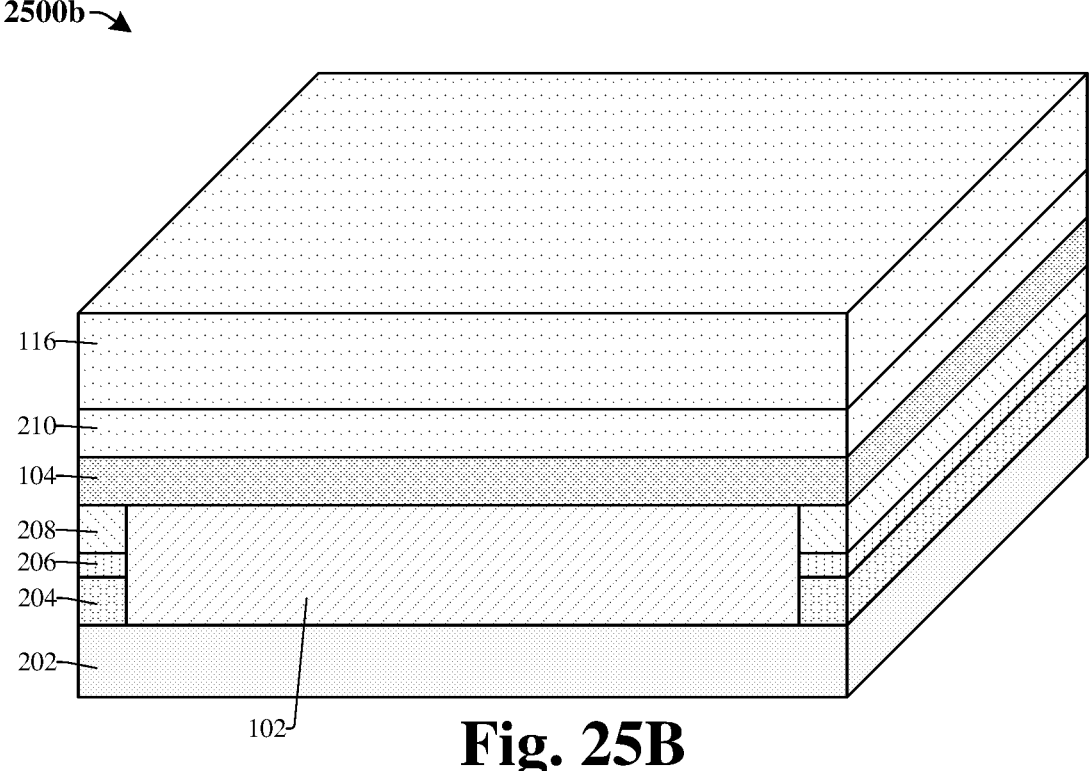

As shown in cross-sectional view 2500a of FIG. 25A and corresponding three-dimensional view 2500b of FIG. 25B, dielectric layer 116 is deposited over the channel structure 106 and over dielectric layer 210. In some embodiments, dielectric layer 116 comprises silicon dioxide or some other suitable material. In some embodiments, dielectric layer 116 is deposited by a CVD process, a PVD process, an ALD process, or some other suitable process.

Figure 26A:
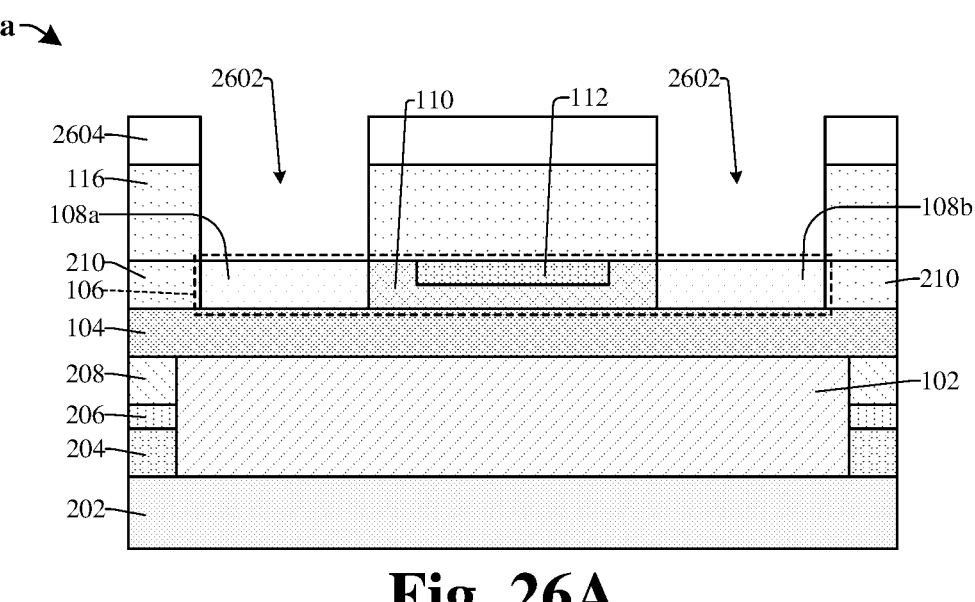
Figure 26B:
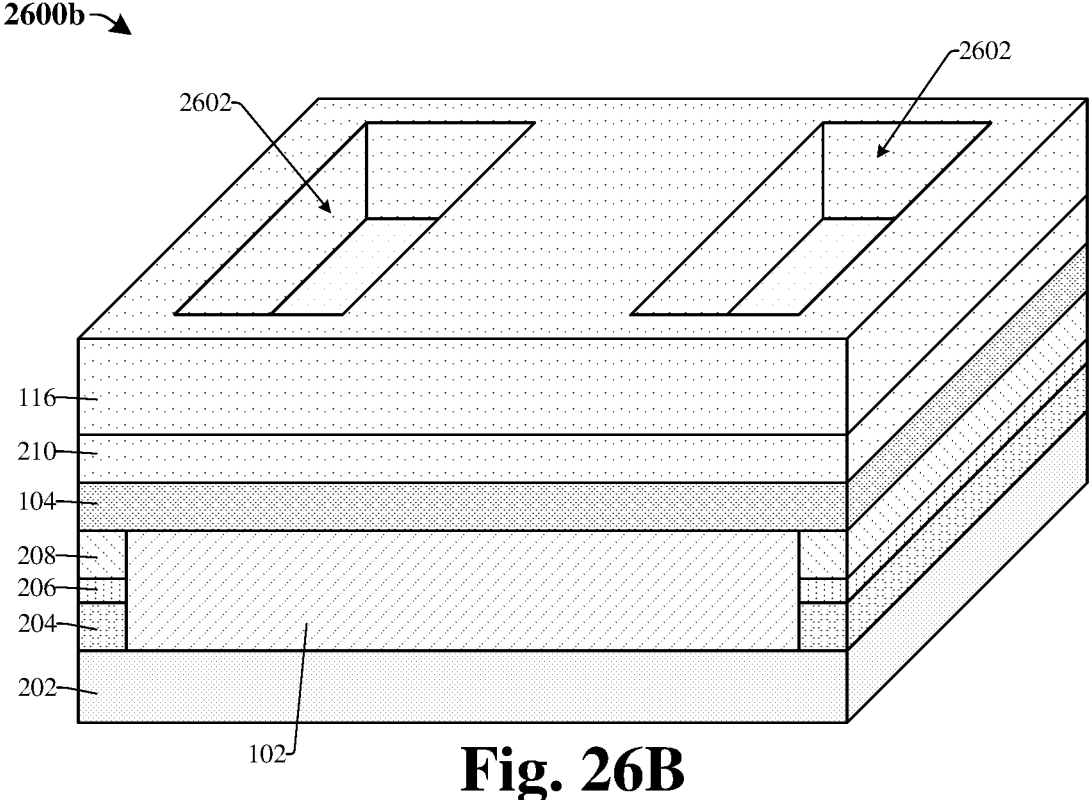

As shown in cross-sectional view 2600a of FIG. 26A and corresponding three-dimensional view 2600b of FIG. 26B, dielectric layer 116 is etched to form a pair of source/drain openings 2602 (e.g., a first source/drain opening and a second source/drain opening) in dielectric layer 116. The source/drain openings 2602 extend through dielectric layer 116 to top surfaces of the channel segments 108a, 108b. The source/drain openings 2602 are delimited by sidewalls of dielectric layer 116 and the top surfaces of the channel segments 108a, 108b.

In some embodiments, a masking layer 2604 is formed over dielectric layer 116 and the etching is performed according to the masking layer 2604. In some embodiments, the etching comprises a dry etching process or some other suitable etching process. In some embodiments, the masking layer 2604 comprises a photoresist layer, a hard mask layer, or some other suitable layer. In some embodiments, the masking layer 2604 is removed during and/or after the etching. Masking layer 2604 is not shown in FIG. 26B for simplicity and clarity of illustration.

In some embodiments, the etching extends into the first channel layer 108. As a result, top surfaces of the channel segments 108a, 108b are below top surfaces of the second channel layer 110 and the third channel layer 112 (e.g., as illustrated by FIG. 3). In some embodiments (not shown), the sidewalls of dielectric layer 116 that delimit the source/drain openings 2602 are laterally offset from sidewalls of the channel segments 108a, 108b. As a result, sidewalls of the source/drain electrodes (e.g., 114a, 114b of FIGS. 27A, 27B) are laterally offset from the sidewalls of the channel segments 108a, 108b. For example, the sidewalls of the source/drain electrodes (e.g., 114a, 114b of FIGS. 27A, 27B) may be directly over top surfaces of the second channel layer 110 and/or top surfaces of dielectric layer 210.

Figure 27A:
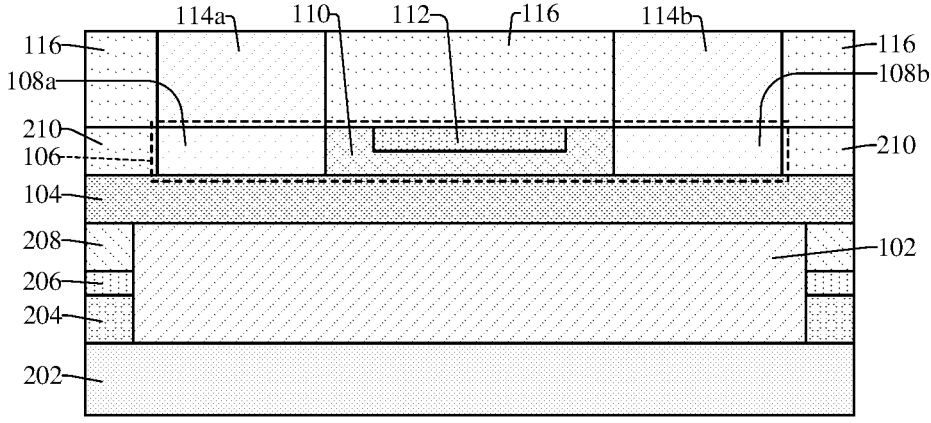
Figure 27B:
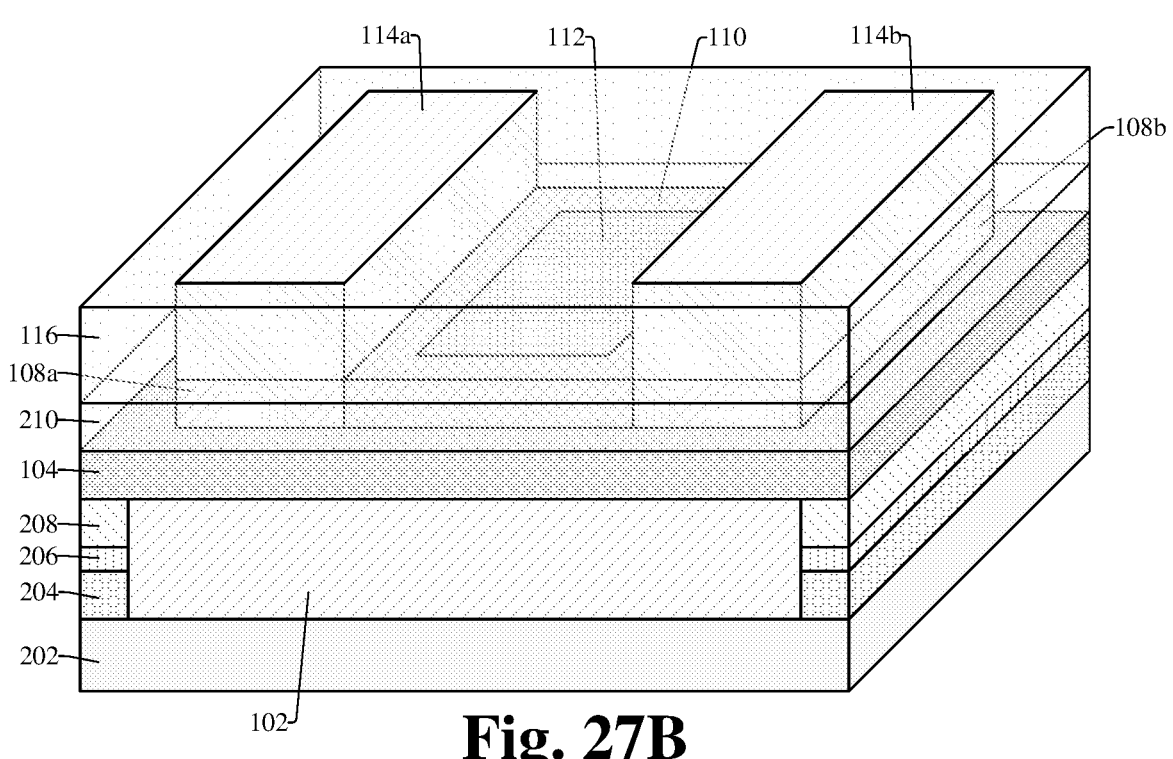

As shown in cross-sectional view 2700a of FIG. 27A and corresponding three-dimensional view 2700b of FIG. 27B, a pair of source/drain electrodes (e.g., a first source/drain electrode 114a and second source/drain electrode 114b) are formed in the pair of source/drain openings (e.g., 2602 of FIGS. 26A, 26B). In some embodiments, the source/drain electrodes 114a, 114b comprise titanium nitride, tungsten, or some other suitable material. In some embodiments, the source/drain electrodes 114a, 114b are formed by depositing (e.g., by a CVD process, a PVD process, an ALD process, or some other suitable process) a conductive source/drain layer over dielectric layer 116 and in the source/drain openings and subsequently performing a planarization process (e.g., a CMP or some other suitable process) on the conductive source/drain layer to remove the conductive source/drain layer from over dielectric layer 116. Dielectric layer 210 and dielectric layer 116 are illustrated as being translucent in FIGS. 27B, 28B, 29B for clarity of illustration.

Figure 28A:
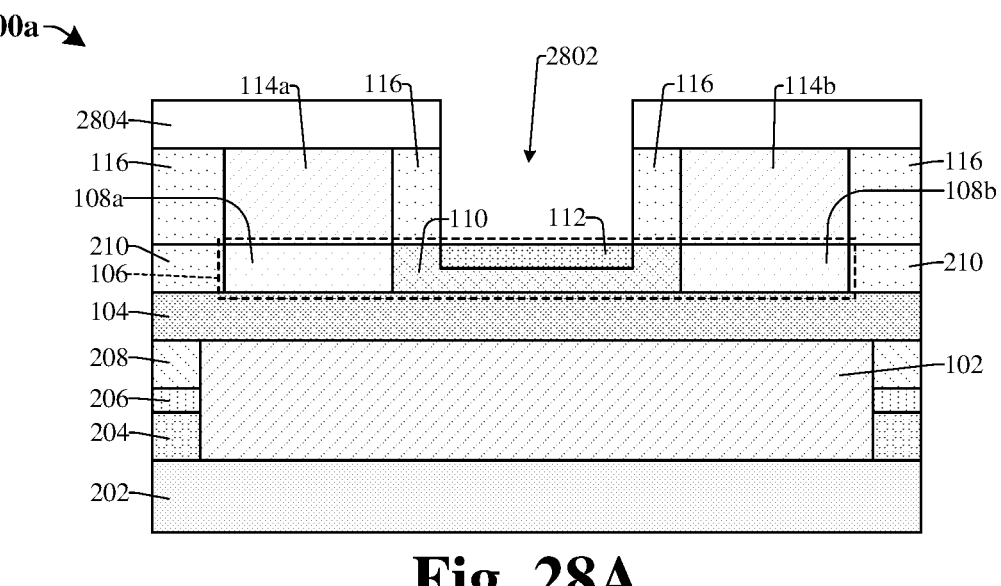
Figure 28B:
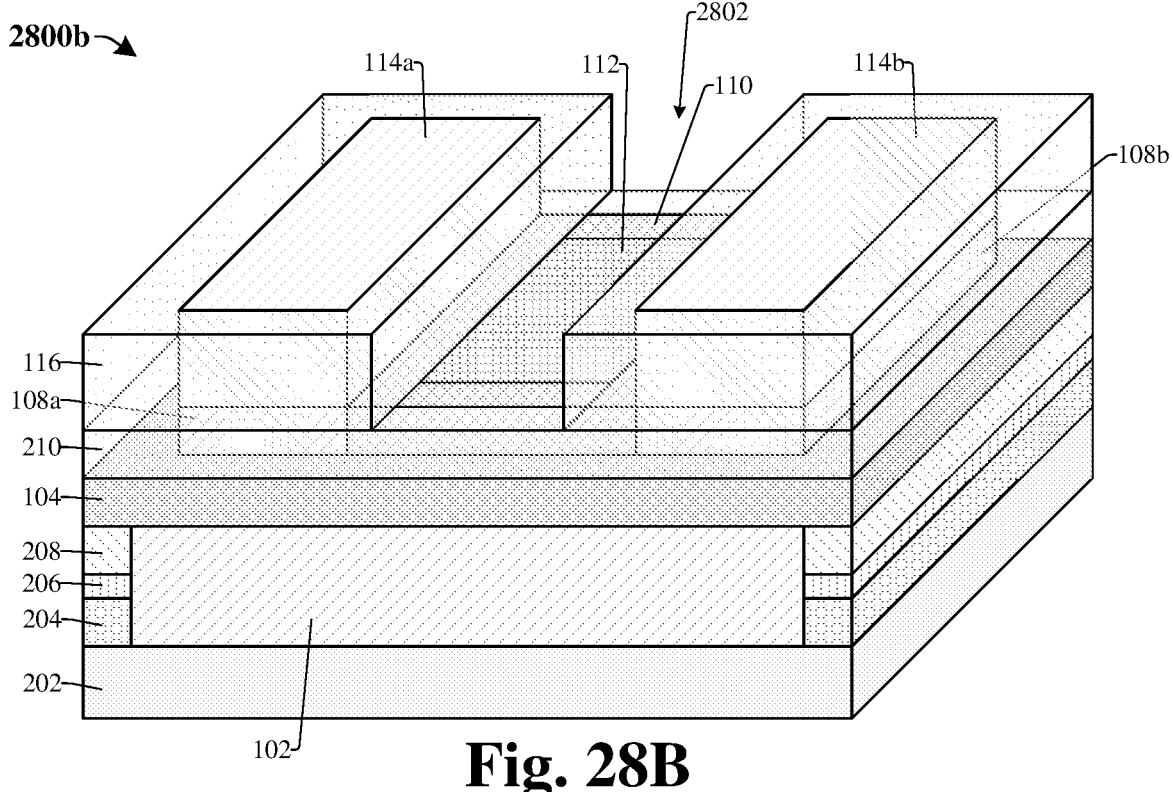

As shown in cross-sectional view 2800a of FIG. 28A and corresponding three-dimensional view 2800b of FIG. 28B, dielectric layer 116 is etched to form a second gate opening 2802 in dielectric layer 116. The second gate opening 2802 extends through dielectric layer 116 to a top surface of the third channel layer 112. The second gate opening 2802 is delimited by sidewalls of dielectric layer 116 and the top surface of the third channel layer 112.

In some embodiments, a masking layer 2804 is formed over dielectric layer 116 and the etching is performed according to the masking layer 2804. In some embodiments, the etching comprises a dry etching process or some other suitable etching process. In some embodiments, the masking layer 2804 comprises a photoresist layer, a hard mask layer, or some other suitable layer. In some embodiments, the masking layer 2804 is removed during and/or after the etching. Masking layer 2804 is not shown in FIG. 28B for simplicity and clarity of illustration.

In some embodiments, the sidewalls of dielectric layer 116 that delimit the second gate opening 2802 are laterally offset from sidewalls of the third channel layer 112. As a result, sidewalls of the second gate layer (e.g., 602 of FIGS. 29A, 29B) are laterally offset from the sidewalls of the third channel layer 112 (e.g., as illustrated in FIG. 8 and FIG. 9).

In some embodiments, the etching extends into the second channel layer 110 and/or the third channel layer 112. As a result, a bottom surface the second gate layer (e.g., 602 of FIGS. 29A, 29B) is below topmost surfaces of the second channel layer (e.g., as illustrated in FIG. 10).

Figure 29A:
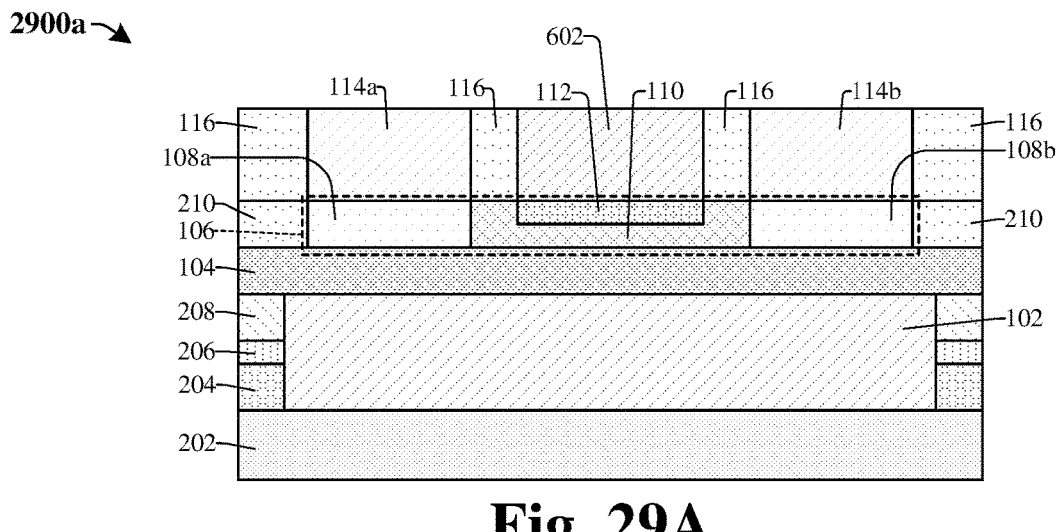
Figure 29B:
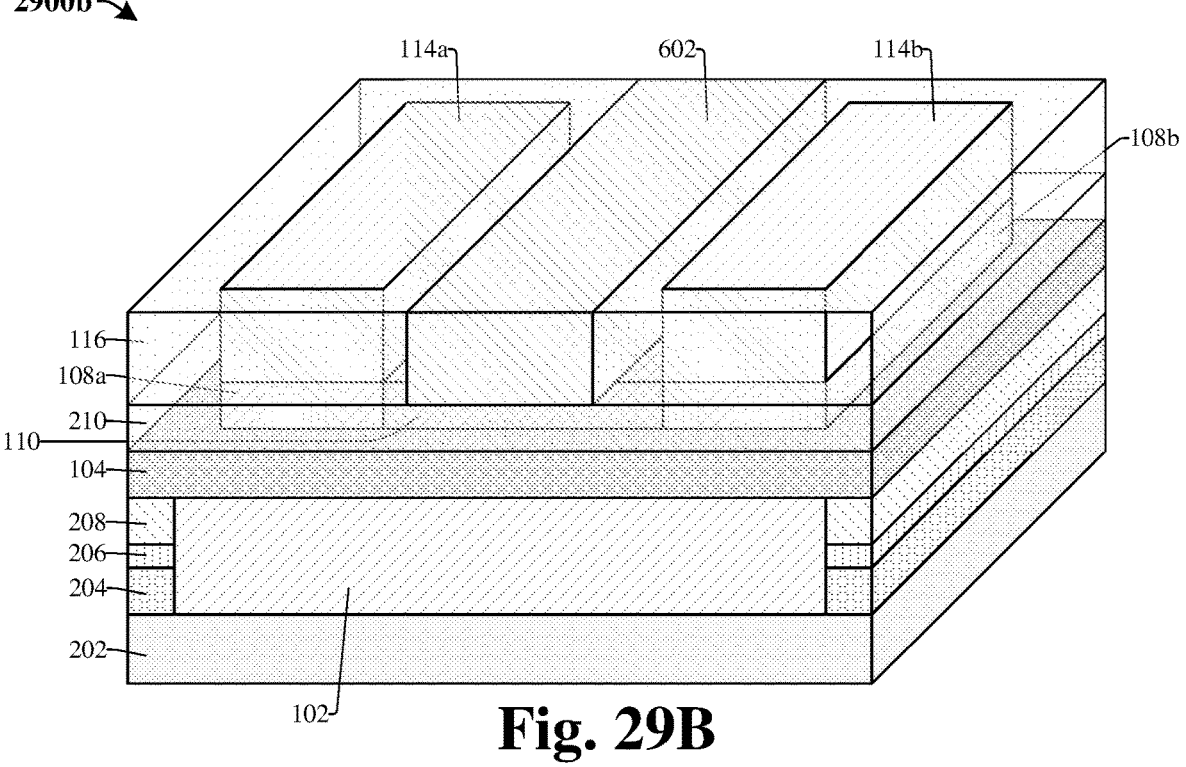

As shown in cross-sectional view 2900*a* of FIG. 29A and corresponding three-dimensional view 2900*b* of FIG. 29B, a second gate layer 602 is formed in the second gate opening (e.g., 2802 of FIGS. 28A, 28B). In some embodiments, the second gate layer 602 comprises tungsten or some other suitable material. In some embodiments, the second gate layer 602 is formed by depositing (e.g., by a CVD process, a PVD process, an ALD process, or some other suitable process) a conductive layer over dielectric layer 116 in the second gate opening and subsequently performing a planarization process (e.g., a CMP or some other suitable process) on the conductive layer to remove the conductive layer from over dielectric layer 116.

FIG. 30 illustrates a flow diagram of some embodiments of a method 3000 for forming a transistor device comprising a plurality of channel layers between a first gate layer and a pair of source/drain electrodes. While method 3000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 3002, form a first gate layer over a base dielectric layer. FIG. 15A illustrates a cross-sectional view 1500*a* of some embodiments corresponding to block 3002.

At block 3004, deposit an insulator layer over the first gate layer. FIG. 16A illustrates a cross-sectional view 1600*a* of some embodiments corresponding to block 3004.

At block 3006, deposit a first channel layer over the insulator layer. FIG. 17A illustrates a cross-sectional view 1700*a* of some embodiments corresponding to block 3006.

At block 3008, etch the first channel layer to delimit a perimeter of the first channel layer. FIG. 18A illustrates a cross-sectional view 1800*a* of some embodiments corresponding to block 3008.

At block 3010, deposit a first dielectric layer over the first channel layer. FIG. 19A illustrates a cross-sectional view 1900*a* of some embodiments corresponding to block 3010.

At block 3012, etch the first dielectric layer and the first channel layer to form a trench in the first dielectric layer and the first channel layer. FIG. 20A illustrates a cross-sectional view 2000*a* of some embodiments corresponding to block 3012.

At block 3014, deposit a second channel layer in the trench. FIG. 21A illustrates a cross-sectional view 2100*a* of some embodiments corresponding to block 3014.

At block 3016, deposit a third channel layer in the trench. FIG. 22A illustrates a cross-sectional view 2200*a* of some embodiments corresponding to block 3016.

At block 3018, deposit a second dielectric layer in the trench to fill the trench. FIG. 23A illustrates a cross-sectional view 2300*a* of some embodiments corresponding to block 3018.

At block 3020, perform a planarization process on the second dielectric layer, the third channel layer, the second channel layer, and the first dielectric layer. FIG. 24A illustrates a cross-sectional view 2400*a* of some embodiments corresponding to block 3020.

At block 3022, form a pair of source/drain electrodes laterally spaced apart over the first channel layer. FIG. 27A illustrates a cross-sectional view 2700*a* of some embodiments corresponding to block 3022.

At block 3024, form a second gate layer directly between the pair of source/drain electrodes. FIG. 29A illustrates a cross-sectional view 2900*a* of some embodiments corresponding to block 3024.

Thus, the present disclosure relates to a transistor device and a method for forming the transistor device, the transistor device comprising a plurality of channel layers for improving a performance of the transistor device.

Accordingly, in some embodiments, the present disclosure relates to an integrated chip including a gate layer. An insulator layer is over the gate layer. A channel structure is over the insulator layer. A pair of source/drains are over the channel structure and laterally spaced apart by a dielectric layer. The channel structure includes a first channel layer between the insulator layer and the pair of source/drains, a second channel layer between the insulator layer and the dielectric layer, and a third channel layer between the second channel layer and the dielectric layer. The first channel layer, the second channel layer, and the third channel layer include different semiconductors.

In other embodiments, the present disclosure relates to an integrated chip including a gate layer and an insulator layer over the gate layer. A pair of source/drain electrodes are over the insulator layer. A dielectric layer is over the insulator layer and laterally between the pair of source/drain electrodes. The integrated chip further includes a first channel layer. The first channel layer includes a pair of channel segments directly over the insulator layer and directly under the pair of source/drain electrodes, respectively. The pair of channel segments include a first semiconductor having a first carrier concentration. A second channel layer is directly over the insulator layer, directly under the dielectric layer, and laterally between the pair of channel segments. The second channel layer includes a second semiconductor having a second carrier concentration, different from the first carrier concentration. A third channel layer is directly over the second channel layer, directly under the dielectric layer, and directly between sidewalls of the second channel layer.

In yet other embodiments, the present disclosure relates to a method for forming an integrated chip. The method includes depositing an insulator layer over a base dielectric layer. A first channel layer is deposited over the insulator layer. The first channel layer includes a first semiconductor having a first carrier concentration. A first dielectric layer is deposited over the first channel layer. The first dielectric layer and the first channel layer are etched to form a trench in the first dielectric layer and the first channel layer. The trench is delimited by sidewalls of the first dielectric layer, sidewalls of the first channel layer, and an upper surface of the insulator layer. A second channel layer is deposited in the trench along the sidewalls of the first dielectric layer, along the sidewalls of the first channel layer, and along the upper surface of the insulator layer. The second channel layer includes a second semiconductor having a second carrier concentration, different from the first carrier concentration. A third channel layer is deposited in the trench along sidewalls and an upper surface of the second channel layer. A planarization process is performed on the third channel layer, the second channel layer, and the first dielectric layer. A pair of source/drains are formed directly over the first channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:

depositing an insulator layer over a base dielectric layer;

depositing a first channel layer over the insulator layer, the first channel layer comprising a first semiconductor having a first carrier concentration;

depositing a first dielectric layer over the first channel layer;

etching the first dielectric layer and the first channel layer to form a trench in the first dielectric layer and the first channel layer, wherein the trench is delimited by sidewalls of the first dielectric layer, sidewalls of the first channel layer, and an upper surface of the insulator layer;

depositing a second channel layer in the trench along the sidewalls of the first dielectric layer, along the sidewalls of the first channel layer, and along the upper surface of the insulator layer, the second channel layer comprising a second semiconductor having a second carrier concentration, different from the first carrier concentration;

depositing a third channel layer in the trench along sidewalls and an upper surface of the second channel layer;

performing a planarization process on the third channel layer, the second channel layer, and the first dielectric layer; and forming a pair of source/drains directly over the first channel layer.

2. The method of claim 1, wherein the planarization process removes the first dielectric layer from over the first channel layer and uncovers a pair of top surfaces of the first channel layer, and wherein the pair of source/drains are formed on the pair of top surfaces of the first channel layer.

3. The method of claim 1, wherein the third channel layer comprises a third semiconductor having a third carrier concentration, different from the first carrier concentration and the second carrier concentration, wherein the first semiconductor comprises a first metal-oxide having a first metal ratio, wherein the second semiconductor comprises a second metal-oxide having a second metal ratio, less than the first metal ratio, and wherein the third semiconductor comprises a third metal-oxide having a third metal ratio, less than the second metal ratio.

4. The method of claim 1, further comprising:

forming a first gate layer over the base dielectric layer, wherein the insulator layer is formed over the first gate layer; and etching the first channel layer to remove the first channel layer from a periphery of the insulator layer before depositing the first dielectric layer over the first channel layer.

5. The method of claim 1, further comprising:

depositing a second dielectric layer in the trench and over the third channel layer to fill the trench before performing the planarization process.

6. The method of claim 4, further comprising:

depositing a second dielectric layer on the third channel layer, the second channel layer, and the first dielectric layer; and etching the second dielectric layer to form a pair of source/drain openings in the second dielectric layer and to uncover the first channel layer, wherein the pair of source/drains are formed directly over the first channel layer after etching the second dielectric layer by depositing a conductive layer in the pair of source/drain openings and on the first channel layer.

7. The method of claim 6, further comprising:

etching the second dielectric layer to form a gate opening in the second dielectric layer between the pair of source/drains and to uncover the third channel layer; and depositing a second gate layer in the gate opening and on the third channel layer.

8. A method for forming an integrated chip, the method comprising:

depositing a first gate layer to form a first gate electrode over a base dielectric layer;

depositing an insulator layer over the first gate electrode;

depositing a first channel layer comprising a first semiconductor over the insulator layer;

etching the first channel layer to separate a first portion of the first channel layer and a second portion of the first channel layer and to uncover an upper surface of the insulator layer between the first and second portions of the first channel layer;

depositing a second channel layer comprising a second semiconductor between the first and second portions of the first channel layer, along a sidewall of the first portion of the first channel layer, along the upper surface of the insulator layer, and along a sidewall of the second portion of the first channel layer;

depositing a third channel layer comprising a third semiconductor between the first and second portions of the first channel layer, along sidewalls of the second channel layer, and along an upper surface of the second channel layer; and forming a first source/drain electrode on the first portion of the first channel layer and forming a second source/drain electrode on the second portion of the first channel layer.

9. The method of claim 8, wherein a dielectric layer is between the first source/drain electrode and the second source/drain electrode, the method further comprising:

etching the dielectric layer to uncover a portion of the third channel layer and a portion of the second channel layer; and depositing a second gate layer to form a second gate electrode on the portion of the third channel layer, on the portion of the second channel layer, and laterally between the first and second source/drain electrodes.

10. The method of claim 9, wherein the etching of the dielectric layer recesses the third channel layer and the second channel layer, and wherein a bottom surface of the second gate electrode is below a top surface of the second channel layer and below a top surface of the first channel layer.

11. The method of claim 10, wherein a top surface of the third channel layer is below the top surface of the second channel layer and below the top surface of the first channel layer.

12. A method of forming an integrated chip, the method comprising:

forming a first gate electrode;

forming an insulator layer on the first gate electrode;

forming a first portion and a second portion of a first channel layer laterally spaced apart on an upper surface of the insulator layer;

forming a second channel layer on the upper surface of the insulator layer and between the first and second portions of the first channel layer;

forming a third channel layer over the second channel layer and between the first and second portions of the first channel layer, wherein the second channel layer laterally surrounds the third channel layer in a ring-shaped, closed path; and forming a first source/drain electrode on the first portion of the first channel layer and forming a second source/drain electrode on the second portion of the first channel layer.

13. The method of claim 12, wherein the first channel layer comprises a first semiconductor having a first carrier concentration, wherein the second channel layer comprises a second semiconductor having a second carrier concentration less than the first carrier concentration, and wherein the third channel layer comprises a third semiconductor having a third carrier concentration less than the second carrier concentration.

14. The method of claim 12, wherein the second channel layer extends laterally from the first portion of the first channel layer to the second portion of the first channel layer, and wherein the second channel layer separates the third channel layer from the first and second portions of the first channel layer.

15. The method of claim 12, wherein the third channel layer is directly between sidewalls of the first channel layer, directly over the second channel layer, and directly between sidewalls of the second channel layer.

16. The method of claim 12, further comprising:

forming a second gate electrode over the third channel layer and laterally spaced between the first and second source/drain electrodes.

17. The method of claim 16, wherein the third channel layer is between a lower surface of the second gate electrode and an upper surface of the second channel layer.

18. The method of claim 12, wherein the insulator layer comprises a dielectric having a dielectric constant greater than a dielectric constant of silicon dioxide.

19. The method of claim 12, wherein the insulator layer comprises a ferroelectric.

20. The method of claim 12, wherein the first portion and the second portion of the first channel layer contact the upper surface of the insulator layer, and wherein the second channel layer contacts the upper surface of the insulator layer between the first and second portions of the first channel layer.

* * * * *